(12) United States Patent
Cheng et al.

(10) Patent No.: US 12,176,390 B2
(45) Date of Patent: Dec. 24, 2024

(54) SEMICONDUCTOR DEVICE STRUCTURE AND METHOD FOR FORMING THE SEMICONDUCTOR DEVICE STRUCTURE

(71) Applicant: Taiwan Semiconductor Manufacturing Company, Ltd., Hsinchu (TW)

(72) Inventors: Chun-Fai Cheng, Tin Shui Wa (HK); Liang-Yi Chen, Taipei (TW); Chi-An Wang, Hsinchu (TW); Kuan-Chung Chen, Taipei (TW); Chih-Wei Lee, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 411 days.

(21) Appl. No.: 17/678,511

(22) Filed: Feb. 23, 2022

(65) Prior Publication Data

US 2023/0268390 A1    Aug. 24, 2023

(51) Int. Cl.
| | |
|---|---|
| *H01L 29/06* | (2006.01) |
| *H01L 21/8234* | (2006.01) |
| *H01L 29/423* | (2006.01) |
| *H01L 29/66* | (2006.01) |
| *H01L 29/786* | (2006.01) |
| *H01L 31/072* | (2012.01) |

(52) U.S. Cl.
CPC .. *H01L 29/0665* (2013.01); *H01L 21/823412* (2013.01); *H01L 21/823418* (2013.01); *H01L 29/42392* (2013.01); *H01L 29/66742* (2013.01); *H01L 29/78618* (2013.01); *H01L 29/78696* (2013.01)

(58) Field of Classification Search
CPC ......... H01L 29/0665; H01L 21/823412; H01L 21/823418; H01L 29/42392; H01L 29/66742; H01L 29/78618; H01L 29/78696; H01L 21/823878; H01L 29/66439; H01L 29/66545; H01L 29/7845; H01L 21/823842; H01L 27/092; H01L 29/775; H01L 29/0673; H01L 29/7848
USPC ......................................................... 257/15
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

*Primary Examiner* — Theresa T Doan
(74) *Attorney, Agent, or Firm* — Birch, Stewart, Kolasch & Birch, LLP

(57) ABSTRACT

A semiconductor device structure includes nanostructures formed over a substrate. The structure also includes a fin isolation structure formed beside the nanostructures. The structure also includes a work function layer surrounding the nanostructures and covering a sidewall of the fin isolation structure. The structure also includes a gate electrode layer covering the work function layer. The gate electrode layer has an extending portion surrounded by the work function layer.

20 Claims, 18 Drawing Sheets

(56) References Cited

U.S. PATENT DOCUMENTS 11,081,547 B2 * 8/2021 Reboh ................. H01L 21/8221
2020/0227535 A1 * 7/2020 Sung .................. H01L 29/7869

* cited by examiner

SEMICONDUCTOR DEVICE STRUCTURE AND METHOD FOR FORMING THE SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabricating of the GAA features around the nanowire can be challenging. While the current methods being employed have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
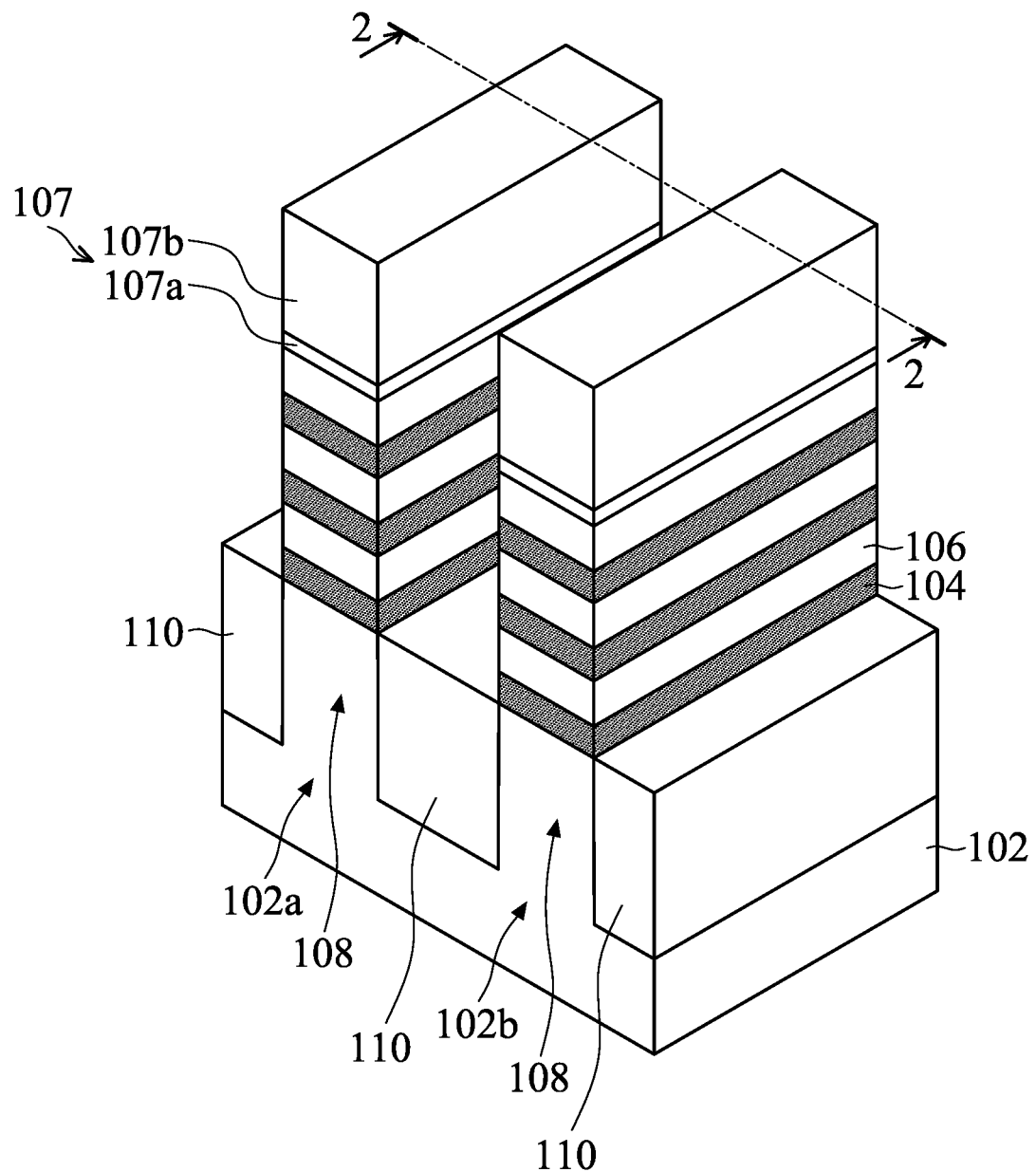
FIGS. 1A-1E are a perspective representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor device structure are provided. The method for forming the semiconductor device structure may include forming a low resistance cladding gate electrode layer formed over and beside nanostructures. The cladding gate electrode layer may reduce gate resistance and the device speed may be improved. The cladding gate electrode layer may also provide channel strain for mobility enhancement.

FIGS. 1A-1E are a perspective representations of various stages of forming a semiconductor device structure 10a, in accordance with some embodiments of the disclosure. The semiconductor device structure 10a is a gate all around (GAA) transistor structure. FIGS. 2A-2G are cross-sectional representations of various stages of forming the semiconductor device structure 10a, in accordance with some embodiments of the disclosure. FIGS. 2A-2G show cross-sectional representations taken along line 2-2 in FIG. 1.

A substrate 102 is provided as shown in FIG. 1A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate. In some embodiments, the substrate 102 includes a first region 102a and a second region 102b. Different types of devices may be formed in the first region 102a and the second region 102b, respectively.

Next, first semiconductor layers 104 and second semiconductor layers 106 are alternating stacked over the substrate 102, as shown in FIG. 1A in accordance with some embodiments. The first semiconductor layers 104 and the second semiconductor layers 106 may include Si, Ge, SiGe, GaAs, InSb, GaP, GaSb, InAlAs, InGaAs, GaSbP, GaAsSb, or InP. The first semiconductor layers 104 and second semiconductor layers 106 may be made of different materials with different etching rates. In some embodiments, for example, the first semiconductor layers 104 are SiGe and the second semiconductor layers 106 are Si.

The first semiconductor layers 104 and second semiconductor layers 106 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor layers 104 and three layers of the second semiconductor layers 106 shown in FIG. 1A, the number of the first semiconductor layers 104 and second semiconductor layers 106 are not limited herein, depending on the demand of performance and process.

Next, a mask structure 107 may be formed and patterned over the first semiconductor layers 104 and second semiconductor layers 106, as shown in FIG. 1A in accordance with some embodiments. The mask structure 107 may be a multilayer structure including a pad layer 107a and a hard mask layer 107b formed over the pad layer 107a. The pad layer 107a may be made of silicon oxide, which may be formed by thermal oxidation or CVD. The hard mask layer 107b may be made of silicon nitride, which may be formed by CVD, such as LPCVD or plasma-enhanced CVD (PECVD). The first semiconductor layers 104 and second semiconductor layers 106 may be patterned to form fin structures 108 using the patterned mask structure as a mask layer.

The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 108 are formed, a liner layer may be formed in the trenches between the fin structures 108 (not shown). The liner layer may be conformally formed over the substrate 102, the fin structure 108, and the mask structure covering the fin structure 108. The liner layer may be used to protect the fin structure 108 from being damaged in the following processes (such as an anneal process or an etching process). The liner layer may be made of silicon nitride. The liner layer may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 110 may be then filled over the liner layer in the trenches between the fin structures 108, as shown in FIG. 1 in accordance with some embodiments. The isolation structure 110 may be made of silicon oxide, silicon nitride, silicon oxynitride, fluoride-doped silicate glass (FSG), or another low-k dielectric material. The isolation structure 110 may be deposited by a deposition process, such as a chemical vapor deposition (CVD) process, a spin-on-glass process, or another applicable process.

Next, an etching process may be performed on the isolation structure 110 and the liner layer. The etching process may be used to remove a top portion of the liner layer and a top portion of the isolation structure 110. As a result, the first semiconductor layers 104 and the second semiconductor layers 106 may be exposed and the remaining isolation structure 110 and the liner layer may surround the base portion of the fin structure 108. The remaining isolation structure 110 may be a shallow trench isolation (STI) structure surrounding the base portion of the fin structure 108. The isolation structure 110 may be configured to prevent electrical interference or crosstalk. Therefore, trenches may be formed between the fin structures 108.

Next, a semiconductor liner layer may be formed over the fin structures 108 (not shown). The semiconductor liner may be a Si layer and may be incorporated into the subsequently formed cladding layer during the epitaxial growth process for forming the cladding layer.

Figure 1B:
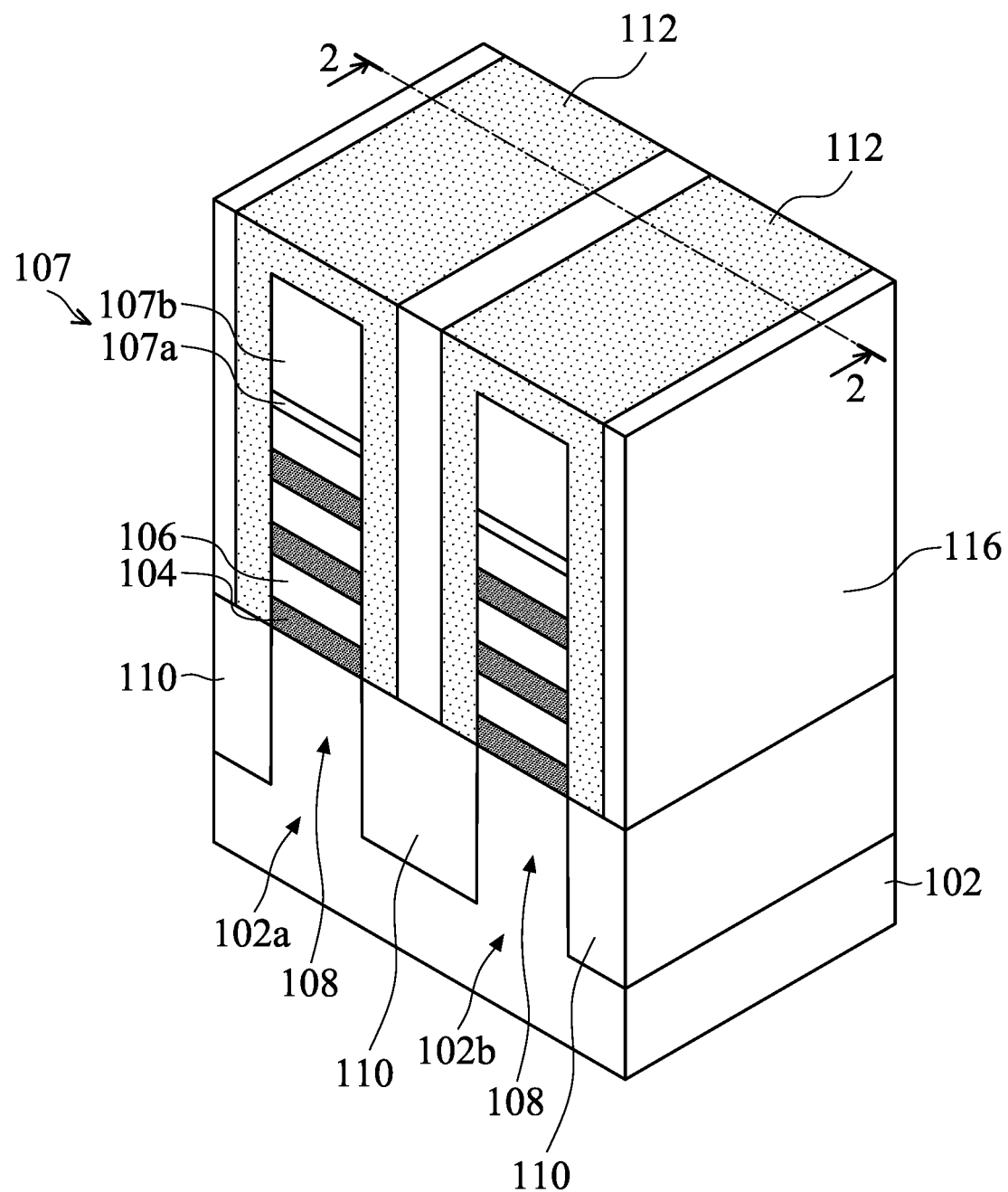

After the semiconductor liner layer is formed, a cladding layer 112 are formed over the top surfaces and the sidewalls of the fin structures 108 and over the isolation structure 110, as shown in FIG. 1B in accordance with some embodiments. The cladding layer 112 may be made of semiconductor materials such as silicon germanium (SiGe). The cladding layer 112 may be formed by performing an epitaxy process, such as VPE and/or UHV CVD, molecular beam epitaxy, other applicable epitaxial growth processes, or combinations thereof. After the cladding layer 112 is deposited, an etching process may be performed to remove the portion of the cladding layer 112 over the top surface of the isolation structure 110. The etching process may include a plasma dry etching process.

Next, a dielectric liner is formed over the cladding layers 112 and the isolation structure 110 (not shown). The dielectric liner may be made of SiN, SiCN, SiOCN, SiON, or the like. The dielectric liner may be made of a dielectric material, such as $HfO_2$, $HfSiO_x$ (such as $HfSiO_4$), HfSiON, HfLaO, HfTaO, HfTiO, HfZrO, HfAlOx, ZrO2, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$-$Al_2O_3$) alloy, other applicable dielectric material, or combinations thereof. The dielectric liner may be deposited using CVD, PVD, ALD, HDPCVD, MOCVD, RPCVD, PECVD, LPCVD, ALCVD, APCVD, other applicable methods, or combinations thereof.

Next, a fin isolation structure 116 is formed to completely fill the spaces between the adjacent fin structures 108, as shown in FIG. 1B in accordance with some embodiments. The fin isolation structure 116 and the dielectric liner may be made of different dielectric materials. The fin isolation structure 116 may be made of a low k dielectric material such as oxide, nitride, SiN, SiCN, SiOCN, SiON, or the like. The fin isolation structure 116 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, a planarization process is performed until the top surfaces of the cladding layer 112 are exposed, as shown in FIG. 1B in accordance with some embodiments. The planarizing process may include a grinding process, a chemical mechanical polishing (CMP) process, an etching process, other applicable processes, or a combination thereof.

Next, the mask structure 107 is removed and the cladding layers 112 are partially removed to expose the top surfaces of the topmost second semiconductor layers 106 (not shown). In some embodiments, the top surfaces of the cladding layers 112 are substantially level with the top surfaces of the topmost second semiconductor layers 106. The mask structures and the cladding layers 112 may be recessed by performing an etching process. The etching processes may be dry etching, wet drying, reactive ion etching, or other applicable etching methods.

Figure 1C:
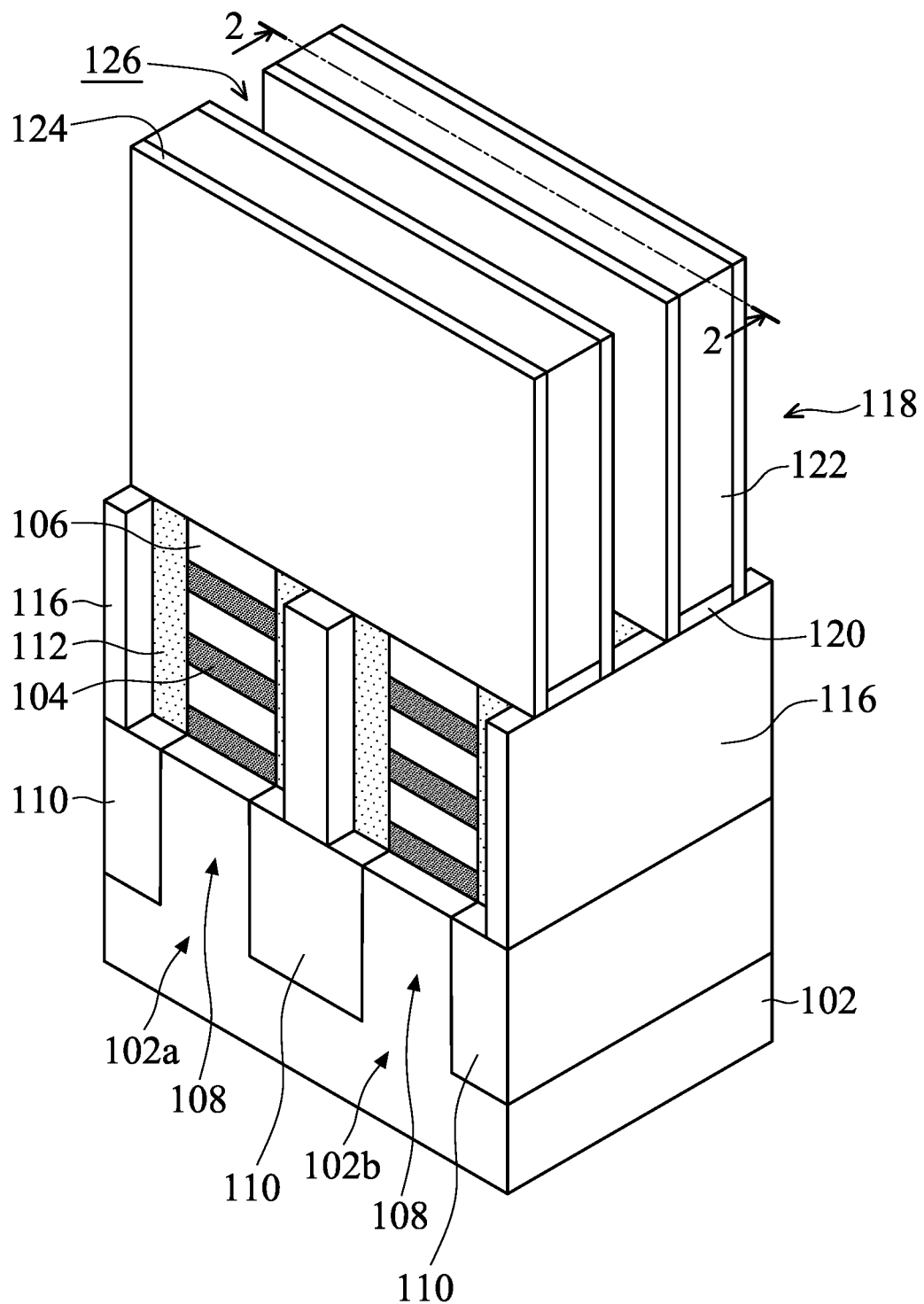

Next, a dummy gate structure 118 is formed over and across the fin structures 108, as shown in FIG. 1C in accordance with some embodiments. The dummy gate structure 118 may include a dummy gate dielectric layer 120 and a dummy gate electrode layer 122. The dummy gate dielectric layer 120 and the dummy gate electrode layer 122 may be replaced by the following steps to form a real gate structure with a high-k dielectric layer and a metal gate electrode layer.

The dummy gate dielectric layer 120 may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer 120 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 122 may include polycrystalline-silicon (poly-Si), poly-crystalline silicon-germanium (poly-SiGe), other applicable materials, or a combination thereof. The dummy gate electrode layer 122 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer 120 and the dummy gate electrode layer 122 to form the dummy gate structure 118 by using a patterned photoresist layer as a mask (not shown). The etching process may be a dry etching process or a wet etching process. The dummy gate dielectric layer 120 and the dummy gate electrode layer 122 may be etched by a dry etching process. The dry etching process may include using a fluorine-based etchant gas, such as $SF_6$, $C_xF_y$ (where x and y may be positive integers), $NF_3$, or a combination thereof. After the etching process, the first semiconductor layers 104 and the second semiconductor layers 106 may be exposed on opposite sides of the dummy gate structure 118.

Next, a conformal dielectric layer is formed over the substrate 102 and the dummy gate structure 118, and then an etching process is performed. A pair of spacer layers 124 is formed on opposite sidewalls of the dummy gate structure 118, and a source/drain opening 126 is formed between adjacent dummy gate structures 118, as shown in FIG. 1C in accordance with some embodiments. The spacer layers 124 may be made of silicon oxide, silicon nitride, silicon oxynitride, and/or dielectric materials. The spacer layers 124 may be formed by a chemical vapor deposition (CVD) process, a spin-on-glass process, or another applicable process.

The first semiconductor layers 104 and the second semiconductor layers 106 of the fin structure 108 exposed on opposite sides of the dummy gate structure 114 may be removed in the etching process to form the source/drain opening 126, as shown in FIG. 1C in accordance with some embodiments. The etching process may be a dry etching process or a wet etching process. In some embodiments, the fin structures 108 are etched by a dry etching process. The dry etching process may include using a fluorine-based etchant gas, such as $SF_6$, $C_xF_y$ (where x and y may be positive integers), $NF_3$, or a combination thereof.

Figure 1D:
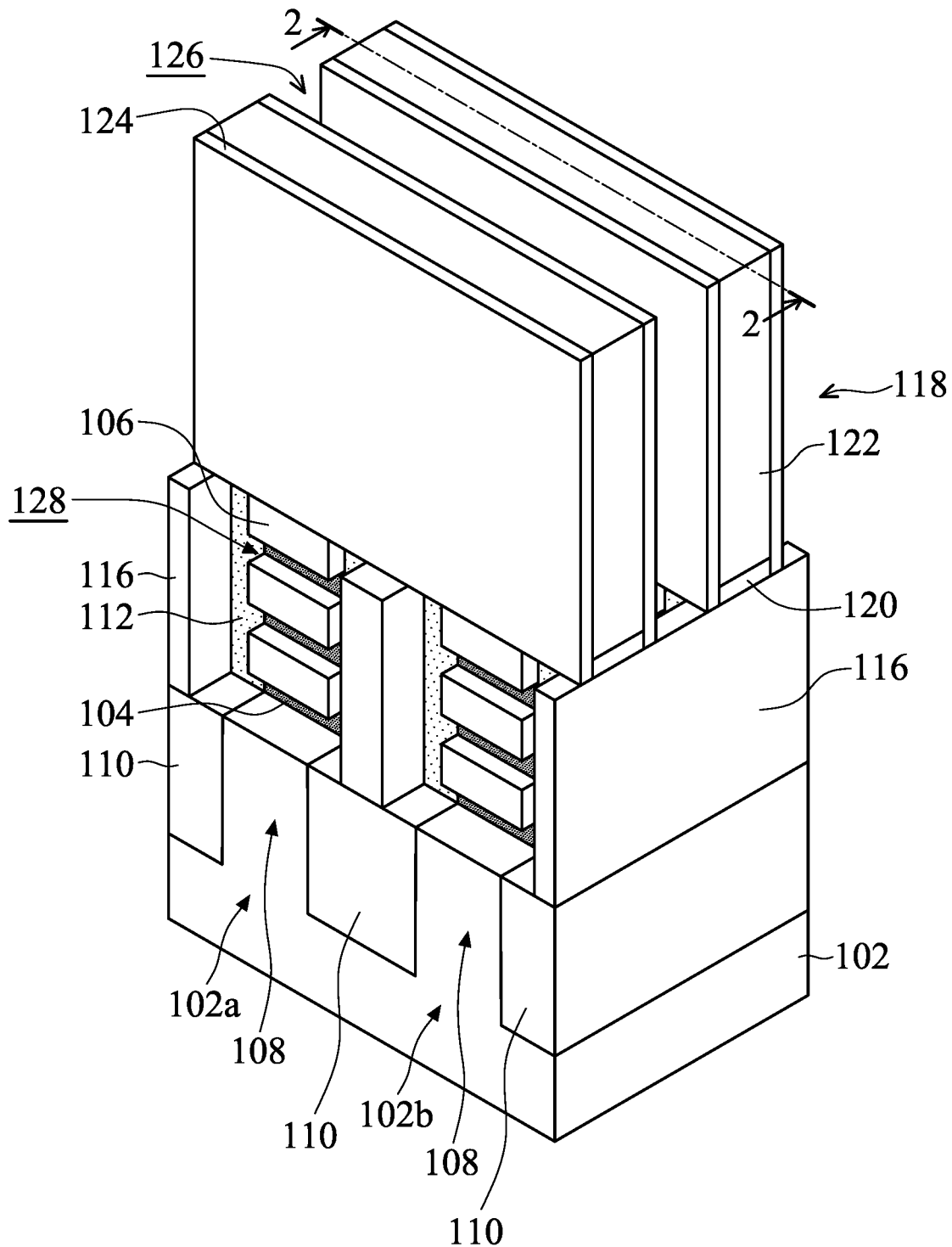

Next, the first semiconductor layers 104 are laterally etched from the source/drain opening 126 to form recesses 128, as shown in FIG. 1D in accordance with some embodiments. The outer portions of the first semiconductor layers 104 may be removed, and the inner portions of the first semiconductor layers 104 under the dummy gate structures 118 or the spacer layers 124 may remain. The lateral etching of the first semiconductor layers 104 may be a dry etching process, a wet etching process, or a combination thereof. After the lateral etching, the sidewalls of the etched first semiconductor layers 104 may be not aligned with the sidewalls of the second semiconductor layers 106. The cladding layer 112 may be exposed in the recess 128.

Next, an inner spacer is formed in the recess 128 (not shown). The inner spacer may provide a barrier between subsequently formed source/drain epitaxial structures 129 and gate structure. The inner spacer may be made of silicon oxide, silicon nitride, silicon carbon nitride (SiCN), silicon oxide carbonitride (SiOCN), or a combination thereof. The inner spacer may be formed by a deposition process. The deposition process may include a CVD process (such as LPCVD, PECVD, SACVD, or FCVD), an ALD process, another applicable method, or a combination thereof.

Figure 1E:
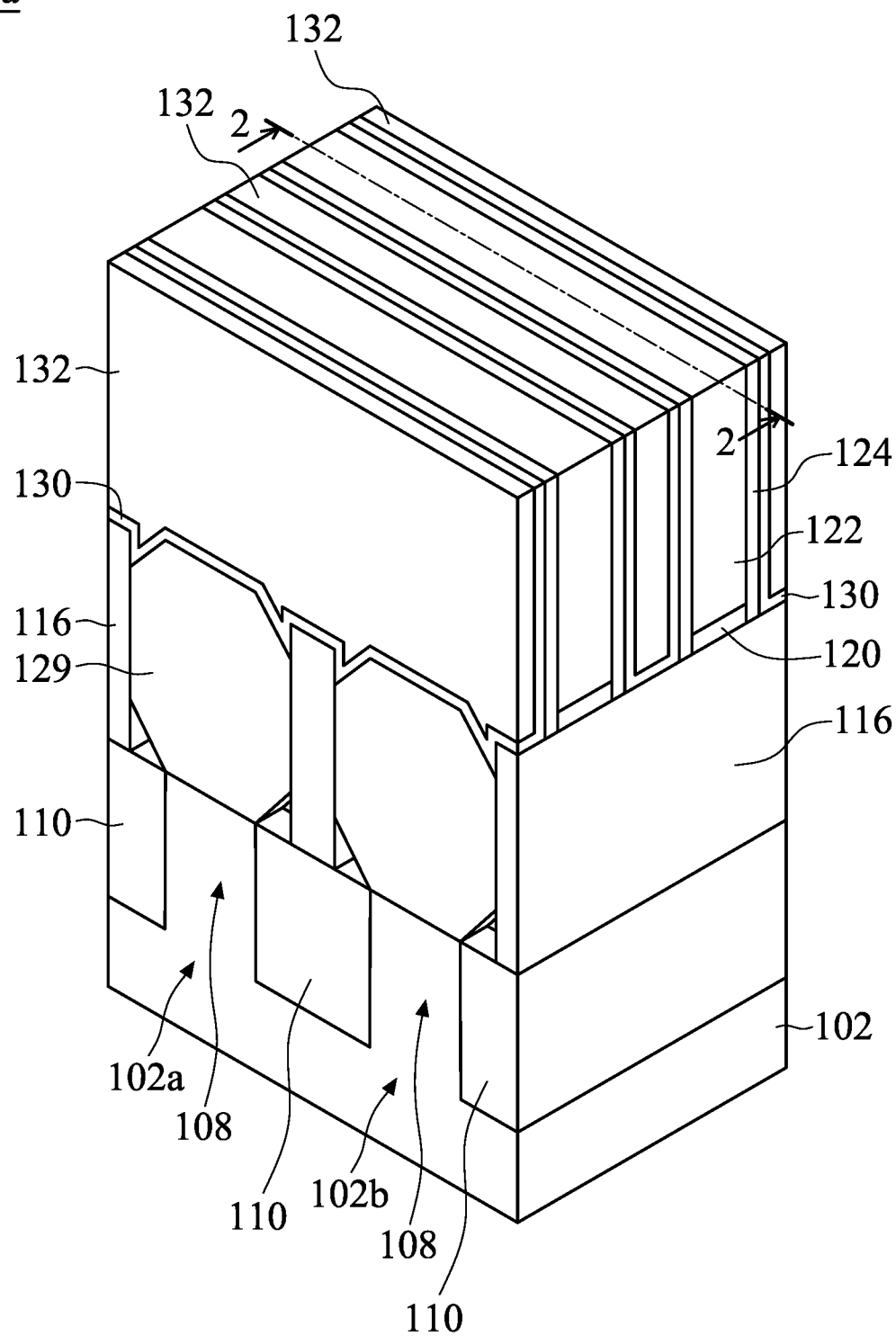

Next, a source/drain epitaxial structure 129 is formed in the source/drain opening 126, as shown in FIG. 1E in accordance with some embodiments. The source/drain epitaxial structure 129 may be formed over opposite sides of the fin structure 108. A strained material may be grown in the source/drain opening 126 by an epitaxial (epi) process to form the source/drain epitaxial structure 129. In addition, the lattice constant of the strained material may be different from the lattice constant of the substrate 102. The source/drain epitaxial structure 129 may include Ge, SiGe, InAs, InGaAs, InSb, GaAs, GaSb, InAlP, InP, SiC, SiP, other applicable materials, or a combination thereof. The source/drain epitaxial structure 129 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method. The source/drain epitaxial structure 129 may be doped with one or more dopants. For example, source/drain epitaxial structure 129 may be silicon germanium (SiGe) doped with boron (B) or another applicable dopant.

Next, an etch stop layer 130 is formed over the source/drain epitaxial structure 129, as shown in FIG. 1E in accordance with some embodiments. The etch stop layer 130 may include silicon nitride, silicon oxide, silicon oxynitride (SiON), other applicable materials, or a combination thereof. The etch stop layer 130 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the source/drain epitaxial structure 129 is formed, an inter-layer dielectric (ILD) structure 132 is formed over the etch stop layer 130, as shown in FIG. 1E in accordance with some embodiments. The ILD structure 132 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 132 may be formed by chemical vapor deposition (CVD), spin-on coating, or other applicable processes.

Afterwards, a planarizing process is performed on the ILD structure 132 until the top surface of the dummy gate structure 118 is exposed (not shown). After the planarizing process, the top surface of the dummy gate structure 118 may be substantially level with the top surfaces of the spacer layers 124 and the ILD structure 132. The planarizing process may include a grinding process, a chemical mechanical polishing (CMP) process, an etching process, other applicable processes, or a combination thereof.

Figure 2A:
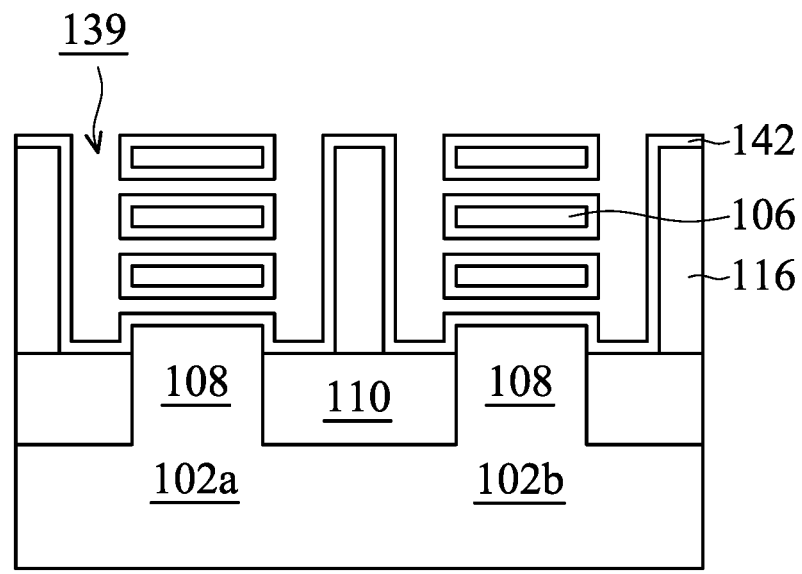
FIGS. 2A-2G are cross-sectional representations of various stages of forming a semiconductor device structure, in accordance with some embodiments of the disclosure.

Next, the dummy gate structure 118 including the dummy gate dielectric layer 120 and a dummy gate electrode layer 122 is removed, as shown in FIG. 2A in accordance with some embodiments. Therefore, a trench is formed between the spacer layers 124 over the fin structure 108 and the second semiconductor layers 106 are exposed from the trench. The dummy gate structure 118 may be removed by a dry etching process or a wet etching process.

After the trenches are formed, the first semiconductor layers 104 are removed to form a gate opening 139, as shown in FIG. 2A in accordance with some embodiments. The removal process may include a selective etching process. The selective etching process may remove the first semiconductor layers 104 and remain the second semiconductor layers 106 as nanostructures 106 as channel regions of the semiconductor device structure 10a, in accordance with some embodiments.

The selective etching process of removing the first semiconductor layers 104 may include a wet etch process, a dry etch process, or a combination thereof. The selective etching process may be a plasma-free dry chemical etching process. The etchant of the dry chemical etching process may include radicals such as HF, $NF_3$, $NH_3$, $H_2$, or a combination thereof.

Figure 2B:
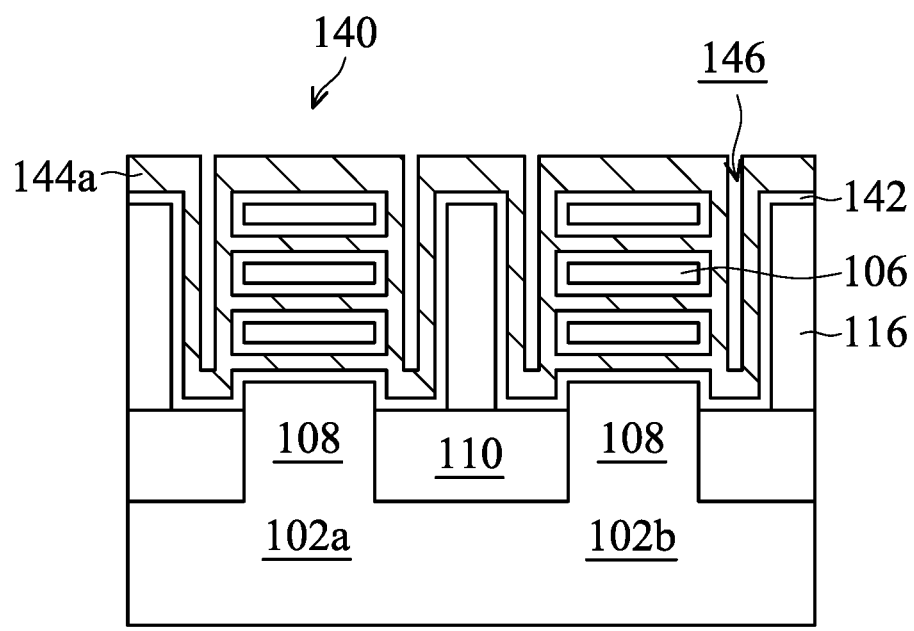

After the gate opening 139 is formed, gate structures 140 are formed surrounding the nanostructure 106, as shown in FIGS. 2A and 2B in accordance with some embodiments. The gate structure 140 surrounding the nanostructure 106 may enhance the gate control ability. The gate structures 140 may be multi-layered structures. Each of the gate structures 140 may include a dielectric layer 142 including an interfacial layer and a high-k dielectric layer, a work function layer, and a gate electrode layer. The nanostructures 106 may be surrounded and in direct contact with the interfacial layers, and the interfacial layers may be surrounded by the high-k dielectric layers. In addition, the dielectric layer 142 may be also formed over the sidewalls of the fin isolation structure 116.

The interfacial layers may be made of silicon oxide, and the interfacial layers may be formed by thermal oxidation. The high-k dielectric layer may include dielectric material, such as $HfO_2$, HfSiO, HfSiON, HfTaO, HfTiO, HfZrO, zirconium oxide, aluminum oxide, titanium oxide, hafnium dioxide-alumina ($HfO_2$-$Al_2O_3$) alloy, other applicable high-k dielectric materials, or a combination thereof. The high-k dielectric layers may be formed by using CVD, ALD, other applicable methods, or a combination thereof.

Next, a first work function layer 144a is conformally formed surrounding the dielectric layer 142 and over the sidewalls of the fin isolation structure 116, as shown in FIG. 2B in accordance with some embodiments. In some embodiments, a gap 146 is formed between the sidewalls of the first work function layer 144a. In some embodiments, a gap 146 is formed between the first work function layer 144a formed over the sidewall of the nanostructures 106 and the first work function layer 144a formed over the sidewall of fin isolation structure 116.

The first work function layer 144a may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The first work function layer 144a may be formed by using CVD, ALD, other applicable methods, or a combination thereof.

Figure 2C:
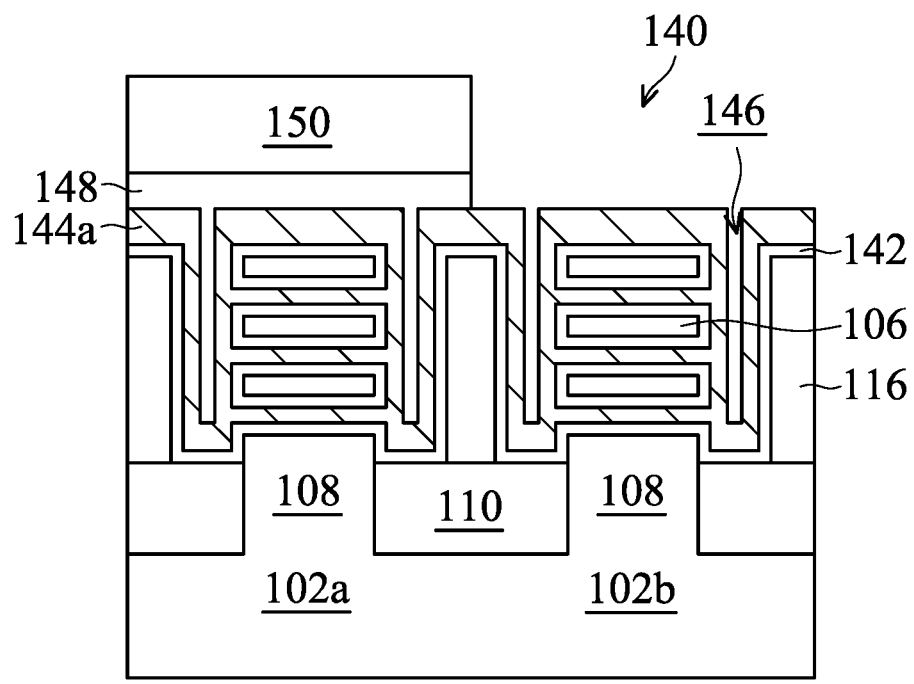

Next, a hard mask layer 148 is formed over the first work function layer 144a and in the gap 146 in the first region 102a, as shown in FIG. 2C in accordance with some embodiments. The hard mask layer 148 may be patterned with a patterned photoresist layer 150 as a mask layer. After the patterning process, the first work function layer 144a in the second region 102b is exposed.

The hard mask layer 148 may be made of silicon nitride, silicon oxide, silicon oxynitride, silicon carbon nitride, silicon carbon oxynitride, aluminum oxide, lanthanum oxide, other applicable materials, or a combination thereof. The hard mask layer 148 may be a multiple layer structure. The hard mask layer 148 may be formed by CVD, such as LPCVD or plasma-enhanced CVD (PECVD). The patterning process may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

The photoresist layer 150 may be made of a photosensitive material such as PBO, PI, BCB, silicone, acrylates, siloxane, another suitable material, or a combination thereof. The photoresist layer 150 may be made of non-organic materials such as silicon oxide, un-doped silicate glass, silicon oxynitride, solder resist (SR), silicon nitride, silicon carbide, hexamethyldisilazane (HMDS), another suitable material, or a combination thereof. The photoresist layer 150 may be deposited using a spray coating process, a spin-on process, a CVD process, an ALD process, a PVD process, another applicable process, or a combination thereof.

Figure 2D:
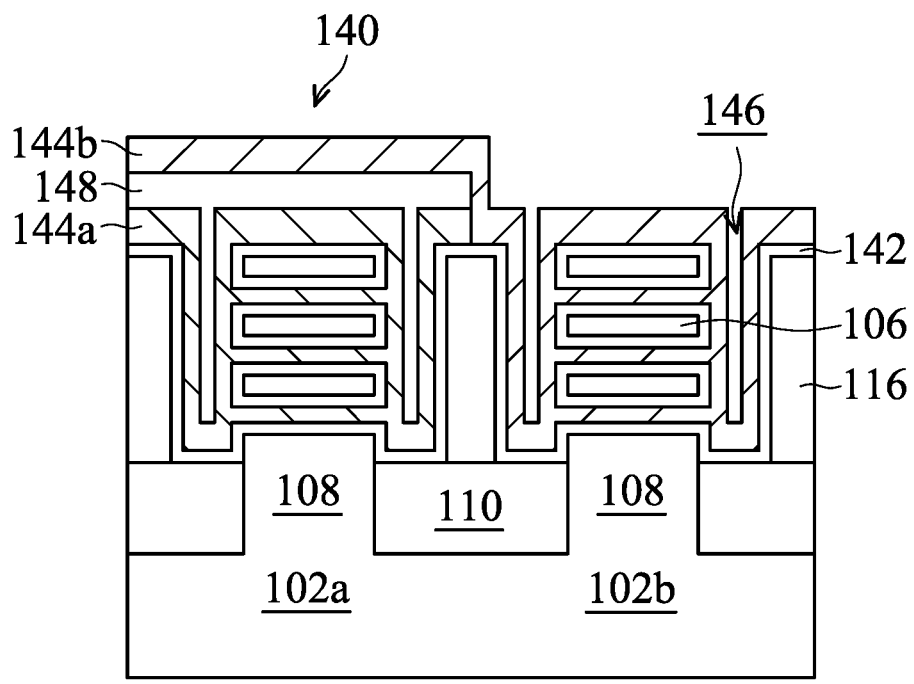

Next, the photoresist layer 150 is removed and a second work function layer 144b is conformally formed in the gate opening 139 in the second region 102b, as shown in FIG. 2D in accordance with some embodiments. The second work function layer 144b may also formed over the hard mask layer 148 in the first region 102a. In some embodiments, the second work function layer 144b surrounds the dielectric layer 142 and the second semiconductor layers 106 in the second region 102b. An gap 146 may be formed between the sidewalls of the second work function layer 144b since the space between the nanostructures 106 and the fin isolation structure 116 may not be completely filled. The second work function layer 144b may also be formed over the sidewalls of the fin isolation structure 116 in the second region 102b. The photoresist layer 150 may be removed by an ashing and stripping process.

In some embodiments, a fin isolation structure 116 is formed between the first work function layer 144a and the second work function layer 144b. In some embodiments, an interface between the first work function layer 144a and the second work function layer 144b is directly above the top surface of the fin isolation structure 116.

The second work function layer 144b may be made of metal materials, and the metal materials may include N-work-function metal or P-work-function metal. In some embodiments, the first work function layer 144a and the second work function layer 144b are made of work function metal of different types. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The P-work-function metal may include titanium nitride (TiN), tungsten nitride (WN), tantalum nitride (TaN), ruthenium (Ru) or a combination thereof. The processes for forming the second work function layer 144b may be the same as, or similar to, those used to form the first work function layer 144a in the previous embodiments. For the purpose of brevity, the descriptions of these processes are not repeated herein.

Figure 2E:
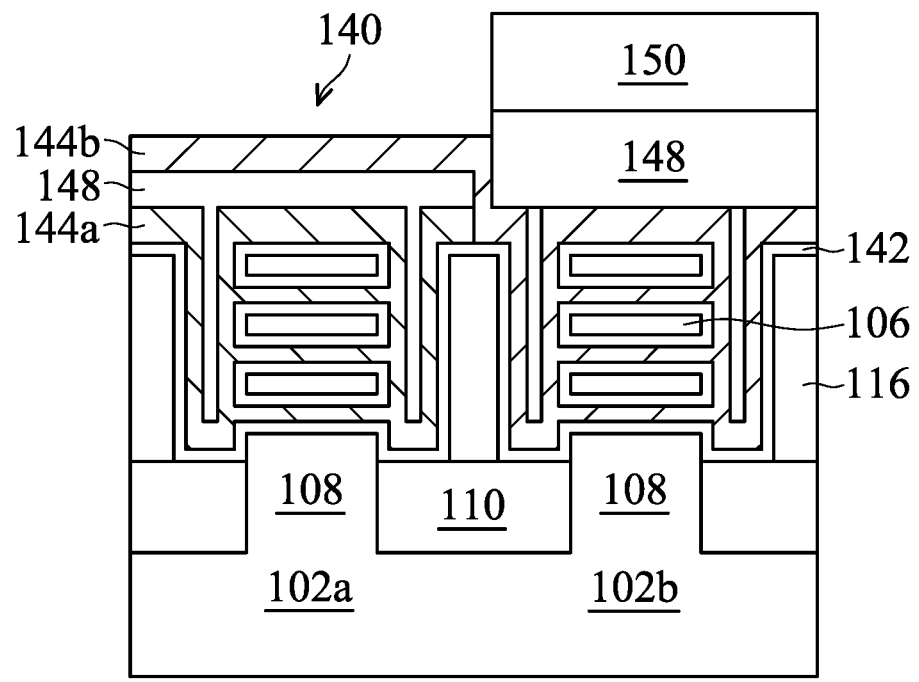

Next, a hard mask layer 148 is formed over the second work function layer 144b and in the gap 146 in the second region 102b, as shown in FIG. 2E in accordance with some embodiments. The hard mask layer 148 may be patterned with a patterned photoresist layer 150 as a mask layer. After the patterning process, the second work function layer 144b in the first region 102a may be exposed. The processes and material for patterning the second work function layer 144b may be the same as, or similar to, those used to pattern the first work function layer 144a in the previous embodiments. For the purpose of brevity, the descriptions of these processes and materials are not repeated herein.

Figure 2F:
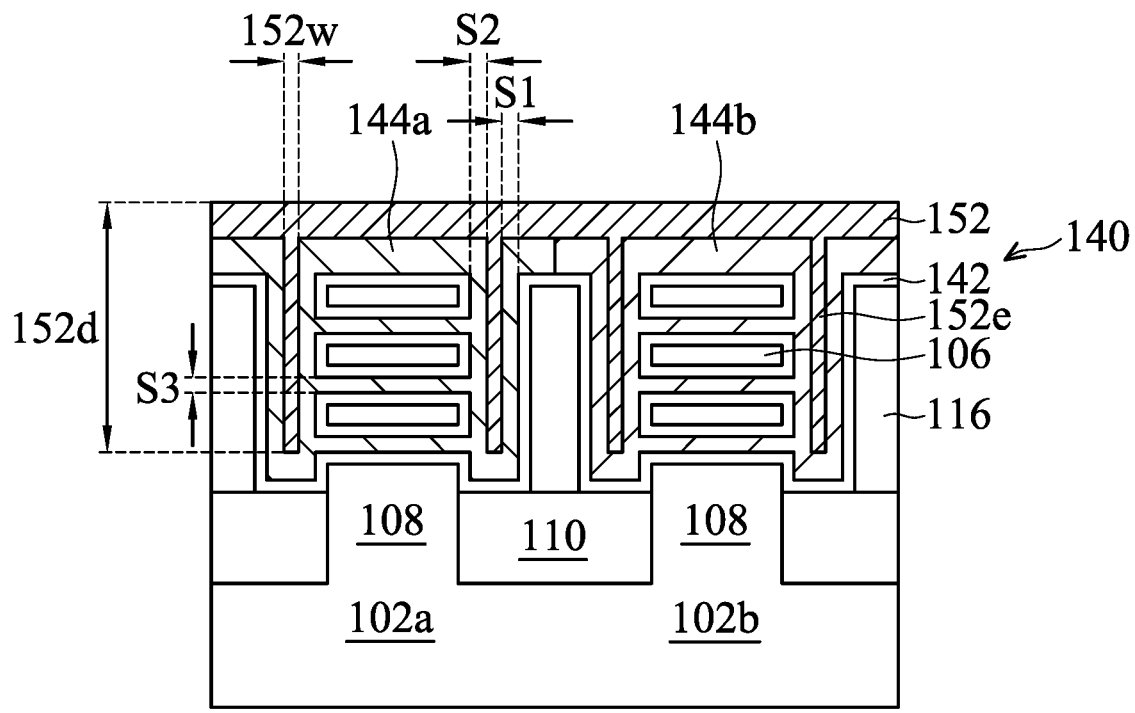

Next, the photoresist layer 150 is removed, the second work function layer 144b over the hard mask layer 148 is removed, and the hard mask layer 148 over the first work function layer 144a and the second work function layer 144b is removed, as shown in FIG. 2F in accordance with some embodiments. The photoresist layer 150 may be removed by an ashing and stripping process. The second work function layer 144b and the hard mask layer 148 are removed by an etching process. The etching processes may be dry etching, wet drying, reactive ion etching, or other applicable etching methods.

Later, a gate electrode layer 152 is formed in the gap 146 and over the first work function layer 144a and the second work function layer 144b, as shown in FIG. 2F in accordance with some embodiments. In some embodiments, the gate electrode layer 152 is a cladding gate electrode formed over and beside the nanostructures 106. In some embodiments, the gate electrode layer 152 has an extending portion 152e formed in the gap 146. In some embodiments, the extending portion 152e of the gate electrode layer 152 is surrounded by the first work function layer 144a and the second work function layer 144b. In some embodiments, the extending portion 152e of the gate electrode layer 152 protrudes in the first work function layer 144a and the second work function layer 144b. In some embodiments, the extending portion 152e of the gate electrode layer 152 is between the nanostructures 106 and the fin isolation structure 116.

The gate electrode layer 116 may be made of one or more layers of conductive material, such as tungsten, TiN, polysilicon, aluminum, copper, titanium, tantalum, cobalt, molybdenum, tantalum nitride, nickel silicide, cobalt silicide, WN, TiAl, TiAlN, TaCN, TaC, TaSiN, metal alloys, another applicable material, or a combination thereof. The gate electrode layer 116 may be formed by using CVD, ALD, electroplating, another applicable method, or a combination thereof.

With the gate electrode layer 116 formed beside the nanostructures 106, the gate resistance may be further reduced since the gate electrode layer is made of a low resistance material. The device speed may be therefore improved. In addition, the gate electrode layer 152 may also provide tensile strain to the channel region, which may enhance mobility.

In some embodiments, the extending portion 152e of the gate electrode layer 152 has a width 152w and a depth 152d. The width 152w of the extending portion 152e of the gate electrode layer 152 is in a range of about 1 nm to about 20 nm. If the extending portion 152e is too narrow, the gate resistance may be too high. If the extending portion 152e is too wide, the cell size may be too large and the cell density may be lowered. The depth 152d of the extending portion 152e of the gate electrode layer 152 is in a range of about 10 nm to about 80 nm. If the extending portion 152e is too shallow, the gate resistance may be too high. In addition, the depth of the extending portion 152e may be confined by the stack height of the nanostructures 106. In some embodiments, the bottom surface of the extending portion 152e is lower than the bottom surface of the bottommost nanostructures 106.

In some embodiments, since the first work function layer 144a and the second work function layer 144b is conformally formed in the gate opening 139, the distance S1 between the extending portion 152e and the fin isolation structure 116 and the distance S2 between the extending portion 152e and the nanostructures 106 are substantially the same. In some embodiments, the distance Si and the distance S2 is greater than half of the vertical spacing S3 between the nanostructures 106. If the distance Si and the distance S2 are too short, the space between the nanostructures 106 may not be filled by the first work function layer 144a and the second work function layer 144b and voids may be formed between the nanostructures 106.

Next, a metal semiconductor compound layer may be formed over the source/drain epitaxial structure 129 (not shown). The metal semiconductor compound layer may reduce the contact resistance between the source/drain epitaxial structure 129 and the subsequently formed source/drain contact structure over the source/drain epitaxial structure 129. The metal semiconductor compound layer may be made of titanium silicide (TiSi$_2$), nickel silicide (NiSi), cobalt silicide (CoSi), or other suitable low-resistance materials. The metal semiconductor compound layer may be formed over the source/drain epitaxial structure 129 by forming a metal layer over the source/drain epitaxial structure 129 first. The metal layer may react with the source/drain epitaxial structure 129 in an annealing process and a metal semiconductor compound layer may be produced. Afterwards, the unreacted metal layer may be removed in an etching process and the metal semiconductor compound layer may be left.

Next, a barrier layer may be conformally formed over the bottom surface and the sidewalls of the source/drain opening 126 (not shown). Afterwards, the barrier layer may be etched back. The barrier layer remains over the bottom surface of the source/drain opening 126. The barrier layer may be formed before filling the conductive material in the source/drain opening 126 to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Afterwards, a source/drain contact structure is formed into the source/drain opening 126 over the source/drain epitaxial structure 129 (not shown). The source/drain contact structure may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The source/drain contact structure may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the source/drain contact structure, and then a planarization process such as a chemical mechanical polishing (CMP) process or an etch back process is optionally performed to remove excess conductive materials. After the planarization process, the top surface of the source/drain contact structure may be level with the top surface of gate structure 140 and the spacer layers 124.

Figure 2G:
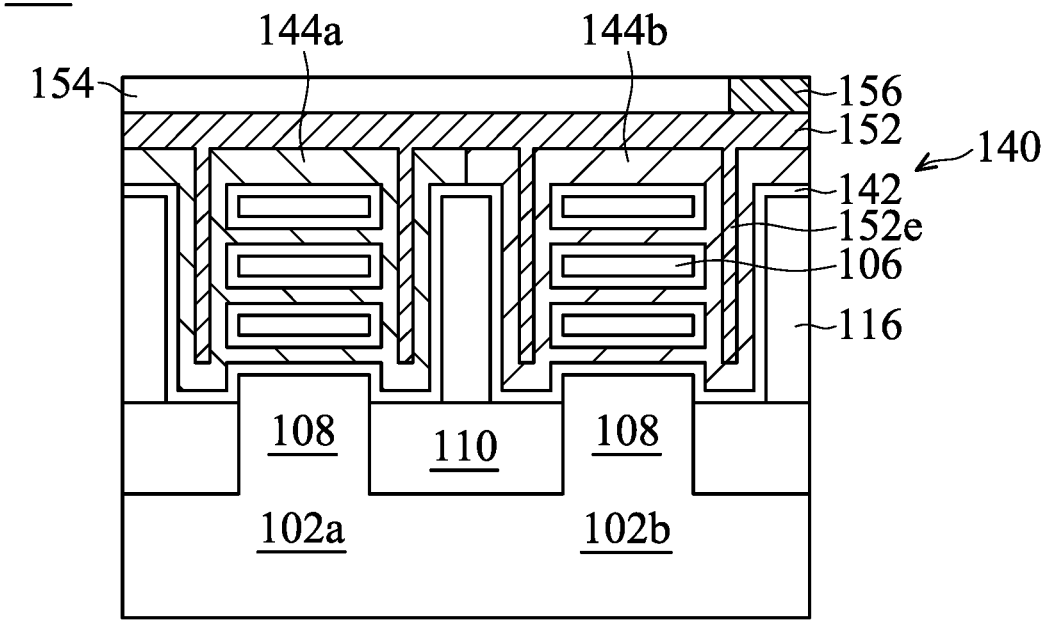

Next, a dielectric layer 154 is formed over the gate structures 140, as shown in FIG. 2G in accordance with some embodiments. The dielectric layer 154 may include multilayers made of multiple dielectric materials, such as Al$_2$O$_3$, ZrO$_2$, silicon oxide, silicon nitride, silicon oxynitride, phosphosilicate glass (PSG), borophosphosilicate glass (BPSG), or other applicable dielectric materials. The dielectric layer 154 may be formed by chemical vapor deposition (CVD), physical vapor deposition, (PVD), atomic layer deposition (ALD), or other applicable processes.

After the dielectric layer 154 is formed, a conductive structure 156 is formed through the dielectric layer 154 and lands on the gate electrode layer 152, as shown in FIG. 2G in accordance with some embodiments. The processes and materials for forming the conductive structure 156 may be the same as, or similar to, those used to form the source/drain contact structure. For the purpose of brevity, the descriptions of these processes and materials are not repeated herein. In some embodiments, the conductive structure 156 and the source/drain contact structure are made of the same conductive material.

With a cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement.

Figure 3:
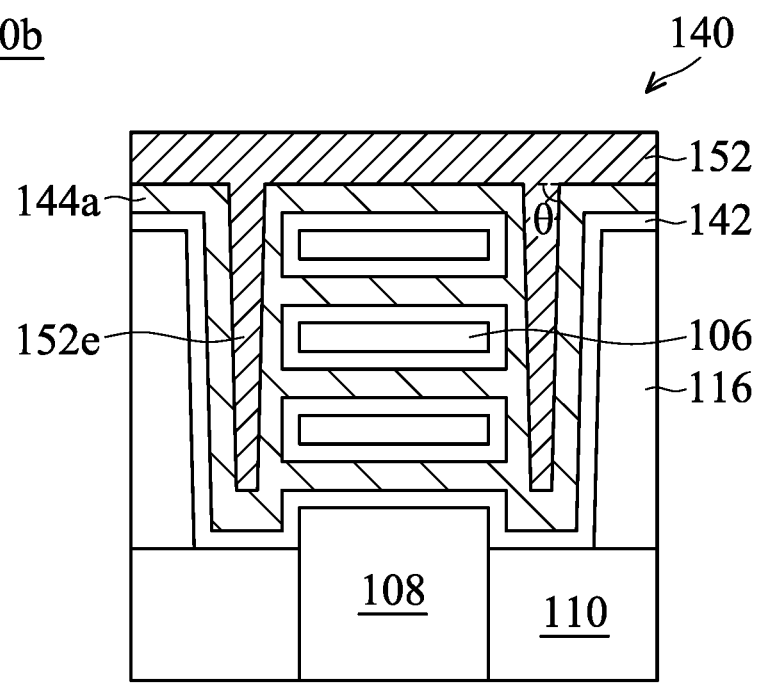
FIG. 3 is an enlarged cross-sectional representation of a semiconductor device structure, in accordance with some embodiments of the disclosure.

Many variations and/or modifications may be made to the embodiments of the disclosure. FIG. 3 is an enlarged cross-sectional representation of a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3 in accordance with some embodiments, the extending portion 152e of the gate electrode layer 152 has a downward trapezoid shape.

In some embodiments, the top portion of the gap 146 is wider than the bottom portion of the gap 146. Therefore, the extending portion 152e of the gate electrode layer 152 filling in the gap 146 has a downward trapezoid shape. In some embodiments, the top surface of the extending portion 152e of the gate electrode layer 152 is wider than the bottom surface of the extending portion 152e of the gate electrode layer 152. In some embodiments, the extending portion 152e of the gate electrode layer 152 has a tapered sidewall.

In some embodiments, the included angle θ between the top surface and the sidewall of the extending portion 152e of the gate electrode layer 152 is in a range of about 70° to about 90°. If the included angle is too less, the extending portion 152e may be too wide, and the device area may be increased and the cell density may be decreased.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The extending portion 152e of the gate electrode layer 152 may have a downward trapezoid shape with a tapered sidewall.

Figure 4:
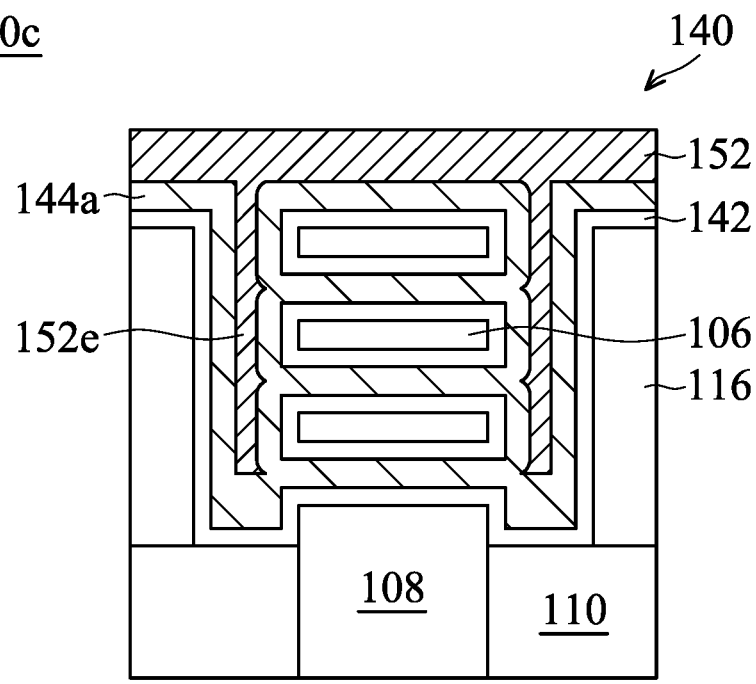
FIG. 4 is an enlarged cross-sectional representation of a semiconductor device structure, in accordance with some embodiments of the disclosure.

Many variations and/or modifications may be made to the embodiments of the disclosure. FIG. 4 is an enlarged cross-sectional representation of a semiconductor device structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4 in accordance with some embodiments, the extending portion 152e of the gate electrode layer 152 has a curved sidewall.

In some embodiments as shown in FIG. 4, the first work function layer 144a is conformally formed over the nanostructures 106, and the gate electrode layer 152 is conformally formed over the first work function layer 144a. Since the first work function layer 144a has a curved sidewall, the gate electrode layer 152 may also have a curved sidewall.

Figure 5A:
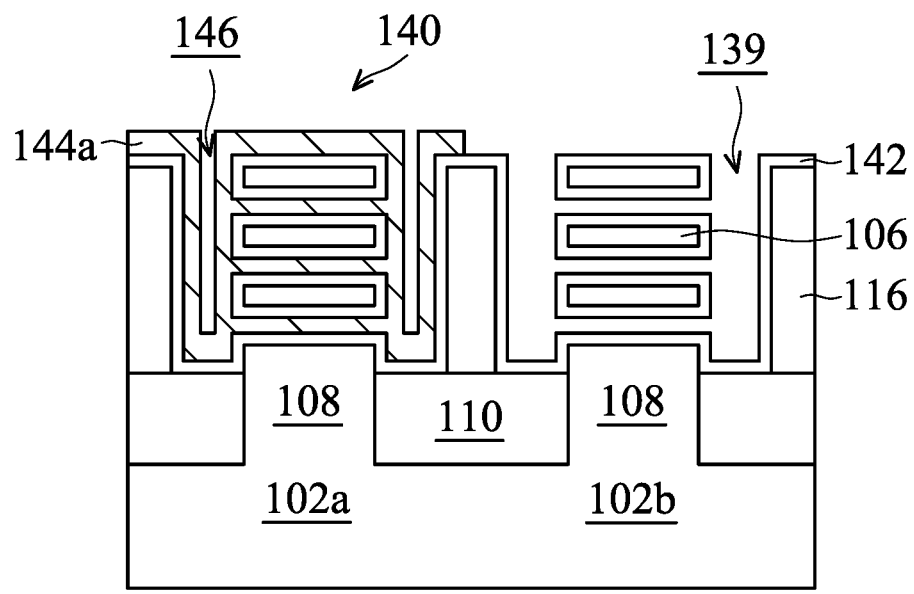
FIGS. 5A-5C are cross-sectional representations of various stages of forming a semiconductor device structure, in accordance with some embodiments of the disclosure.
Figure 5B:
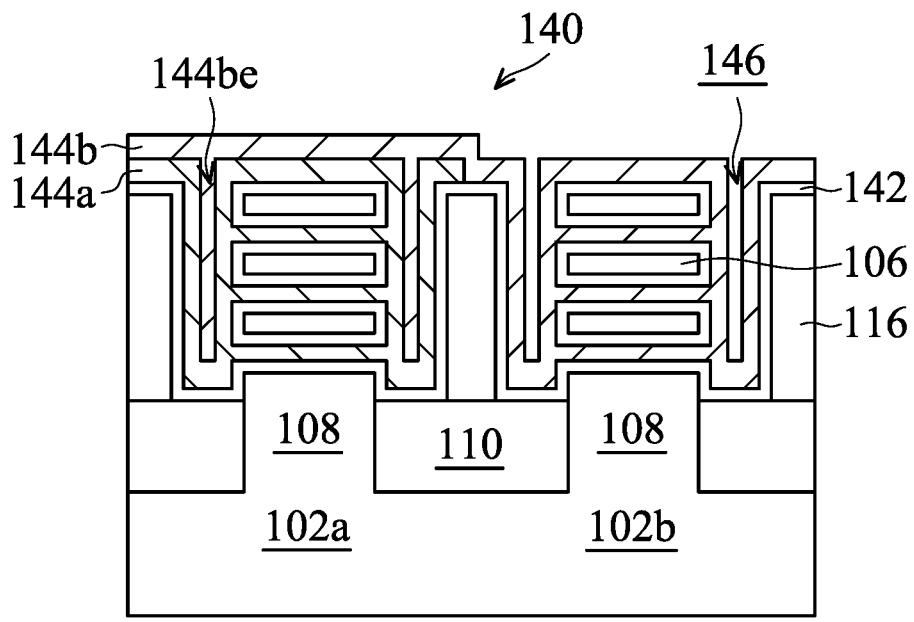
Figure 5C:
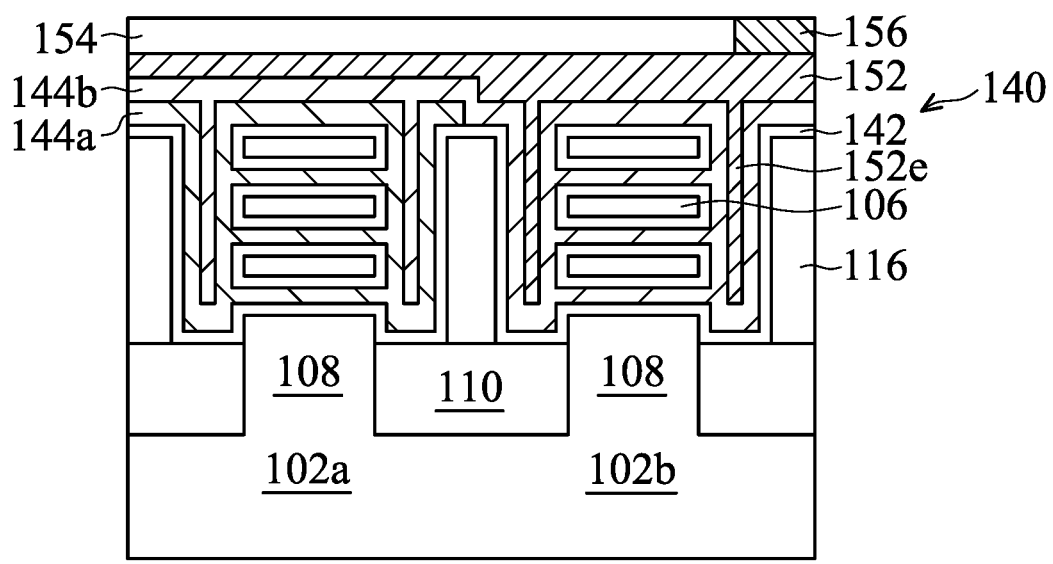

Many variations and/or modifications may be made to the embodiments of the disclosure. FIGS. 5A-5C are cross-sectional representations of various stages of forming a semiconductor device structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIGS. 5A and 5B in accordance with some embodiments, hard mask layer 148 in the first region 102a is removed before forming the second work function layer 144b.

In some embodiments as shown in FIG. 5A, after the first work function layer 144a in the second region 102b is removed, the gate dielectric layer 142 may be exposed in the gate opening 139. Afterwards, the second work function layer 144 is conformally formed over the first work function layer 144a in the first region 102a and in the gate opening 139 in the second region 102b. In some embodiments, the second work function layer 144b is filled in the gap 146 in the first region 102a. Therefore, the second work function layer 144b has an extending portion 144 be surrounded by the first work function layer 144a in the first region 102a. The second work function layer 144b surrounds the nanostructures 106 in the second region 102b. In some embodiments, the second work function layer 144b is in contact with the first work function layer 144a in the first region 102a. In some embodiments, the gap 146 is formed between the sidewalls of the second work function layer 144b in the second region 102b.

Next, a gate electrode layer 152 is formed in the gap 146 and over the first work function layer 144a and the second work function layer 144b, as shown in FIG. 5C in accordance with some embodiments. In some embodiments, the gate electrode layer 152 has an extending portion 152e formed in the gap 146 between the sidewalls of the second work function layer 144b. In some embodiments, the extending portion 152e of the gate electrode layer 152 is surrounded by the second work function layer 144b in the second region 102b. In some embodiments, the extending portion 152e of the gate electrode layer 152 protrudes in the second work function layer 144b. In some embodiments, the extending portion 152e of the gate electrode layer 152 is formed in the second work function layer 144b between the nanostructures 106 and the fin isolation structure 116.

After forming the gate electrode layer 152, a planarization process is performed so that the gate electrode layer 152 may have a flat surface. In some embodiments, the top surface of the second work function layer 144b in the first region 102a is exposed after the planarization process.

Next, a dielectric layer 154 is formed over the gate electrode layer 152, and a conductive structure 156 is formed through the dielectric layer 154 and lands on the gate electrode layer 152, as shown in FIG. 5C in accordance with some embodiments. The processes and materials for forming the gate electrode layer 152, the dielectric layer 154, and the conductive structure 156 may be the same as, or similar to, those used to form the gate electrode layer 152, the dielectric layer 154, and the conductive structure 156 in the previous embodiments. For the purpose of brevity, the descriptions of these processes are not repeated herein.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The gate electrode layer 152 may extends only in the second work function layer 144b in the second region 102b, but not in the first region 102a. The production cost may be reduced since less mask layers is required.

Many variations and/or modifications may be made to the embodiments of the disclosure. FIGS. 6A-6G are cross-sectional representations of various stages of forming a semiconductor device structure 10e, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A, the first work function layer 144a fills up the gate opening 139 in the first region 102a and the second region 102b.

Figure 6A:
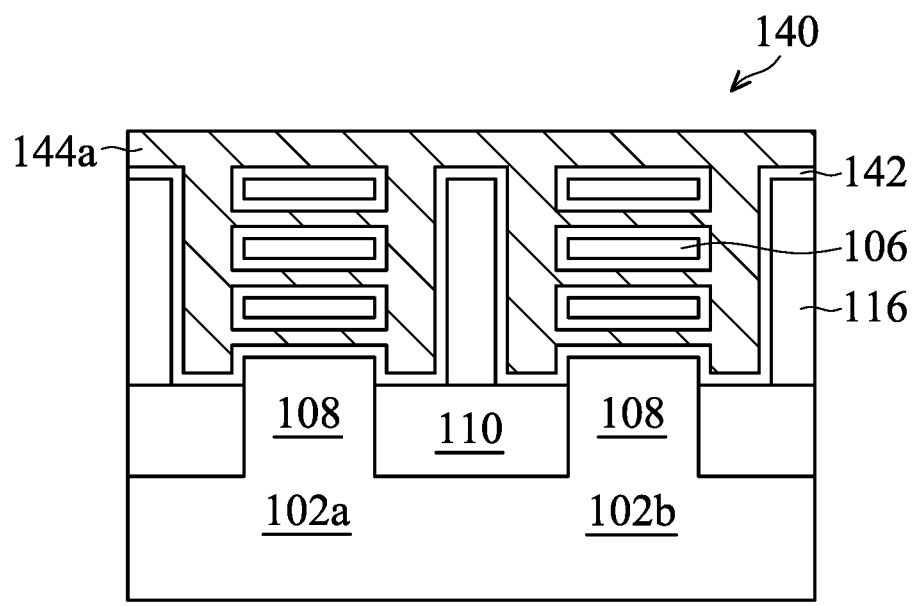
FIGS. 6A-6G are cross-sectional representations of various stages of forming a semiconductor device structure, in accordance with some embodiments of the disclosure.
Figure 6B:
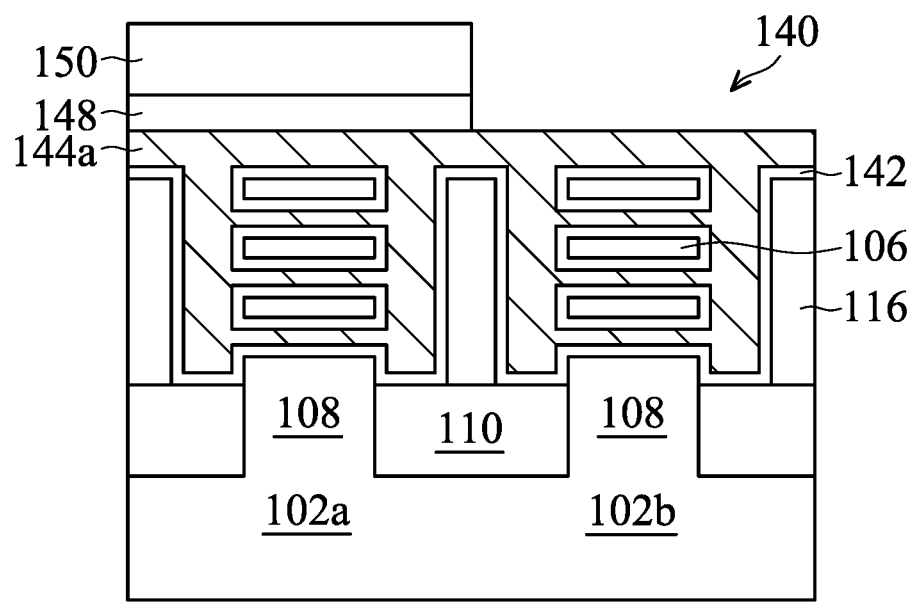
Figure 6C:
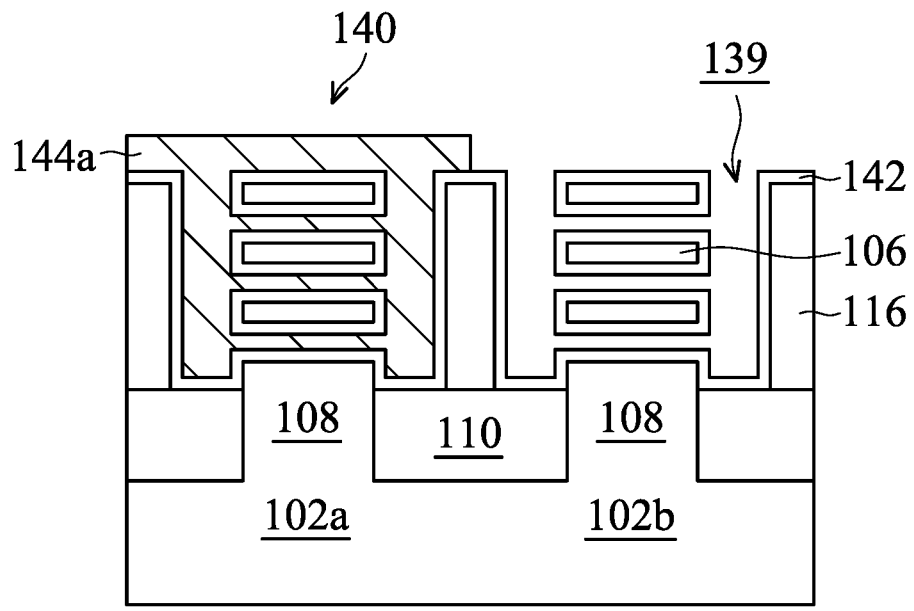

In some embodiments as shown in FIG. 6A, there is no gap formed in the first work function layer 144a. A hard mask layer 148 is formed over the first work function layer 144a, and the hard mask layer 148 is patterned by a patterned photoresist layer 150, as shown in FIG. 6B in accordance with some embodiments. The first work function layer 144a in the second region 102b may be exposed. Next, the first work function layer 144a in the second region 102b may be removed, and the photoresist layer 150 and the hard mask layer 148 in the second region 102b are removed, as shown in FIG. 6C in accordance with some embodiments. A gate opening 139 may be formed in the second region 102b.

Figure 6D:
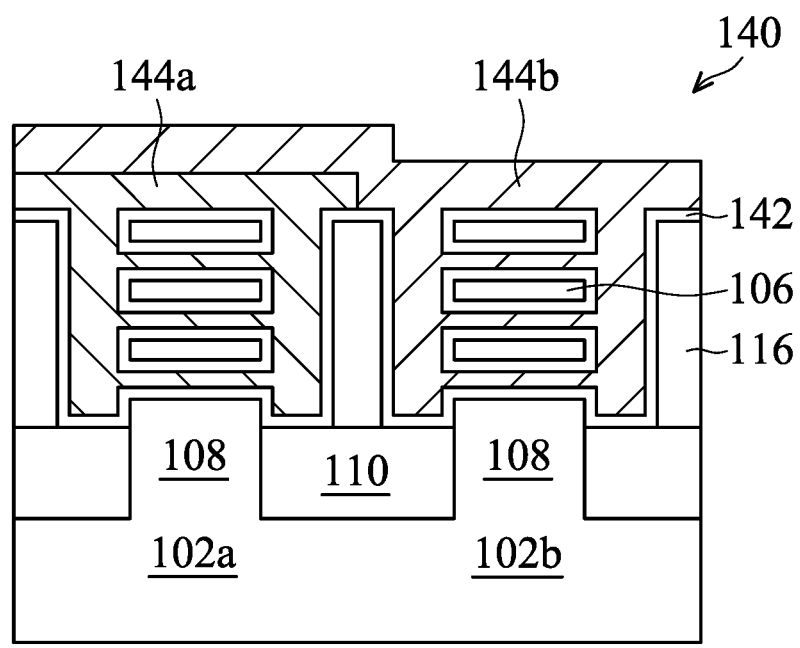
Figure 6E:
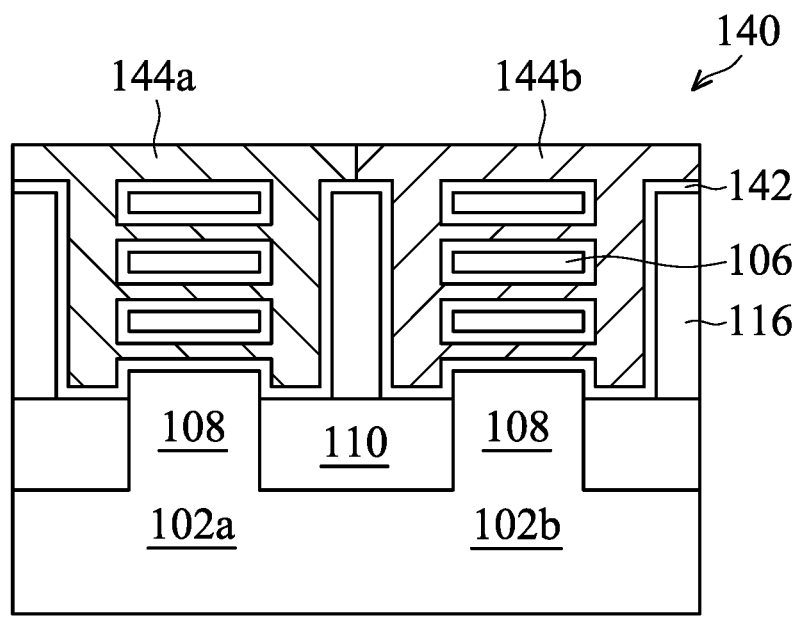

Next, the second work function layer 144b is formed filling up the gate opening 139 in the second region 102b, as shown in FIG. 6D in accordance with some embodiments. In some embodiments, the second work function layer 144b covers the top surface of the first work function layer 144a in the first region 102a. Afterwards, a planarization process is performed on the first work function layer 144a and the second work function layer 144b, as shown in FIG. 6E in accordance with some embodiments. The top surfaces of the first work function layer 144a and the second work function layer 144b are exposed after the planarization process. In some embodiments, the first work function layer 144a and the second work function layer 144b fills up the gate opening 139 without forming gaps inside.

The processes and materials for forming the first work function layer 144a and the second work function layer 144b may be the same as, or similar to, those used to form the first work function layer 144a and the second work function layer 144b in the previous embodiments. For the purpose of brevity, the descriptions of these processes are not repeated herein. In some embodiments, the first work function layer 144a and the second work function layer 144b is thicker than in the previous embodiments.

Figure 6F:
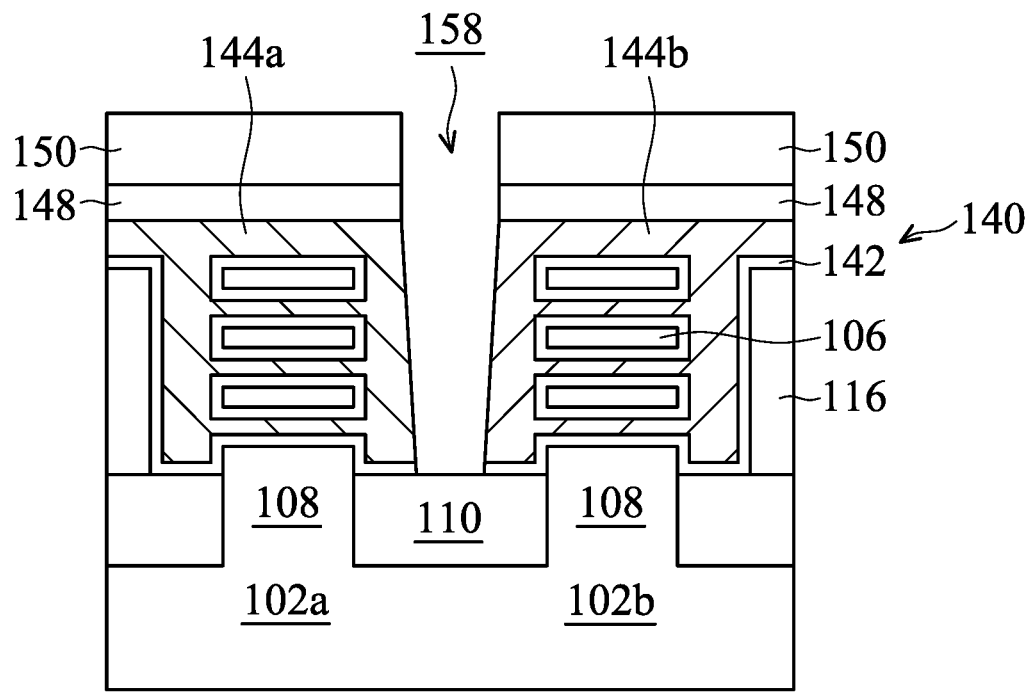

Next, a hard mask layer 148 and a photoresist layer 150 is formed over the first work function layer 144a and the second work function layer 144b, as shown in FIG. 6F in accordance with some embodiments. The hard mask layer 148 and a photoresist layer 150 is patterned so that the first work function layer 144a and the second work function layer 144b above the fin isolation structure 116 between the first work function layer 144a and the second work function layer 144b may be exposed.

Later, the fin isolation structure 116 between the first work function layer 144a and the second work function layer 144b is removed by an etching process, and a trench 158 is formed between the first work function layer 144a and the second work function layer 144b, as shown in FIG. 6F in accordance with some embodiments. In some embodiments, the dielectric layer 142 is exposed in the trench 158. The etching process may be a dry etching process or a wet etching process.

Figure 6G:
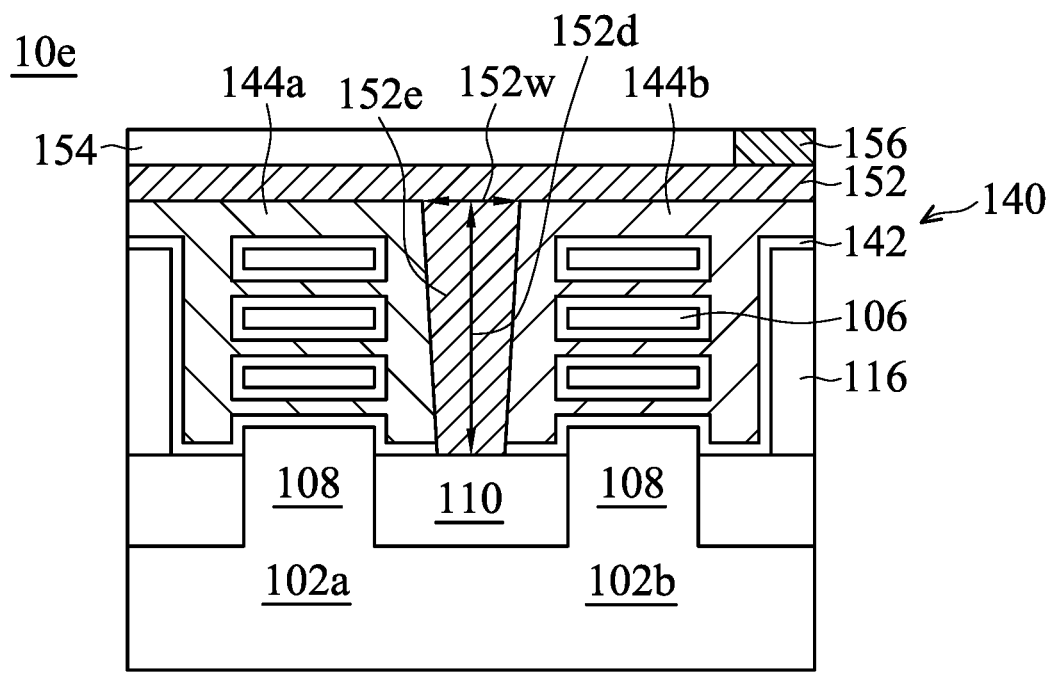

Next, a gate electrode layer 152 is formed in the trench 158 and over the first work function layer 144a and the second work function layer 144b, as shown in FIG. 6G in accordance with some embodiments. The gate electrode layer 152 may have an extending portion 152e formed in the trench 158. In some embodiments, each of the extending portions 152e of the gate electrode layer 152 is in contact with the sidewalls of the first work function layer 144a and the second work function layer 144b. In some embodiments, the bottom surface of the extending portion 152e of the gate electrode layer 152 is substantially level with the bottom surfaces of the first work function layer 144a and the second work function layer 144b.

In some embodiments, the extending portion 152e of the gate electrode layer 152 has a width 152w and a depth 152d. The width 152w of the extending portion 152e of the gate electrode layer 152 is in a range of about 8 nm to about 30 nm. If the extending portion 152e is too narrow, the gate resistance may be too high. If the extending portion 152e is too wide, the cell size may be too large and the cell density may be lowered. The depth 152d of the extending portion 152e of the gate electrode layer 152 is in a range of about 30 nm to about 100 nm. If the extending portion 152e is too shallow, the gate resistance may be too high. The depth 152d of the extending portion 152e of the gate electrode layer 152 is determined by the stack height of the nanostructures 106.

Next, a dielectric layer 154 is formed over the gate electrode layer 152, and a conductive structure 156 is formed through the dielectric layer 154 and lands on the gate electrode layer 152, as shown in FIG. 6G in accordance with some embodiments. The processes and materials for forming the gate electrode layer 152, the dielectric layer 154, and the conductive structure 156 may be the same as, or similar to, those used to form the gate electrode layer 152, the dielectric layer 154, and the conductive structure 156 in the previous embodiments. For the purpose of brevity, the descriptions of these processes are not repeated herein.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The extending portion 152e may be formed in a trench 158 between the first region 102a and the second region 102b. Since the depth 152d and the width 152w of the extending portion 152e of the gate electrode layer 152 is greater than in previous embodiments, the gate resistance may be further reduced.

Figure 7A:
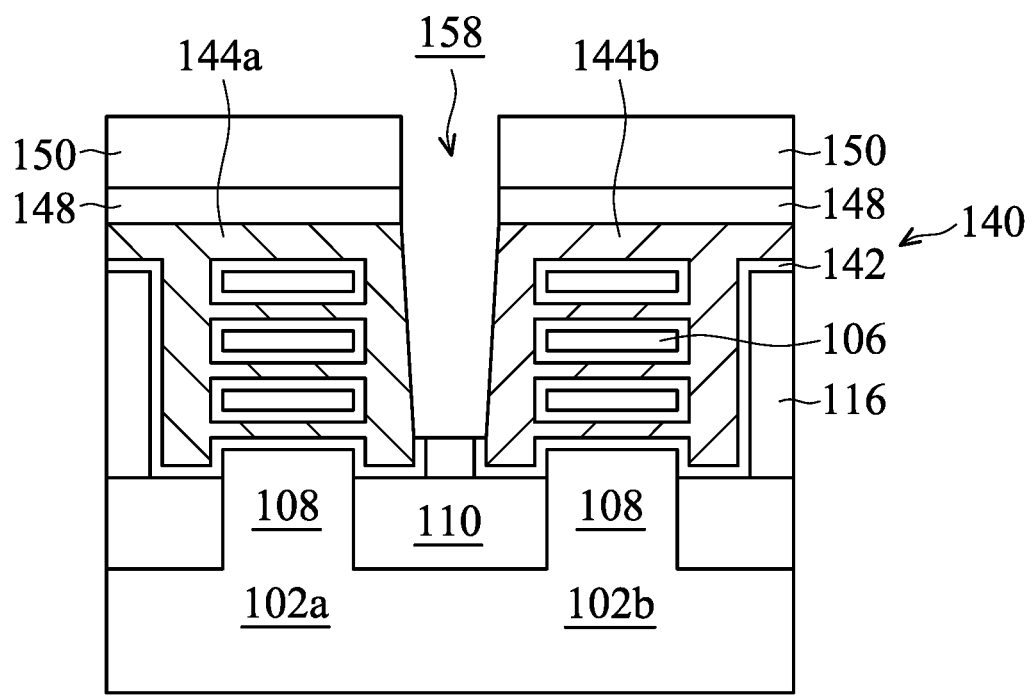
FIGS. 7A-7B are cross-sectional representations of various stages of forming a semiconductor device structure, in accordance with some embodiments of the disclosure.
Figure 7B:
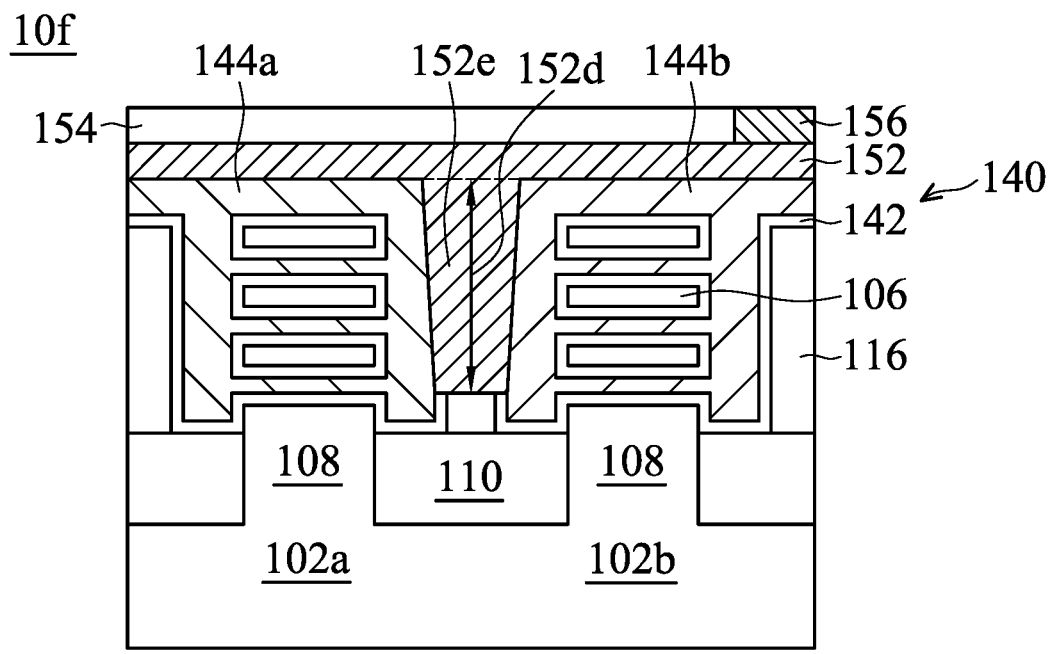

Many variations and/or modifications may be made to the embodiments of the disclosure. FIGS. 7A-7B are cross-sectional representations of various stages of forming a semiconductor device structure 10f, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 7A, the fin isolation structure 116 between the first region 102a and the second region 102b is only partially removed.

In some embodiments as shown in FIG. 7A, the fin isolation structure 116 between the first work function layer 144a and the second work function layer 144b is etched by an etching process, and the top surface of the fin isolation structure 116 is exposed in the trench 158. The etching process may be a dry etching process or a wet etching process.

Next, a gate electrode layer 152 is formed in the trench 158 and over the first work function layer 144a and the second work function layer 144b, as shown in FIG. 7B in accordance with some embodiments. The gate electrode layer 152 may have an extending portion 152e formed in the trench 158. In some embodiments, the bottom surface of the extending portion 152e of the gate electrode layer 152 is in contact with the top surface of the fin isolation structure 116.

In some embodiments, the extending portion 152e of the gate electrode layer 152 has a depth 152d. The depth 152d of the extending portion 152e of the gate electrode layer 152 is in a range of about 30 nm to about 100 nm. If the extending portion 152e is too shallow, the gate resistance may be too high.

Next, a dielectric layer 154 is formed over the gate electrode layer 152, and a conductive structure 156 is formed through the dielectric layer 154 and lands on the gate electrode layer 152, as shown in FIG. 7B in accordance with some embodiments. The processes and materials for forming the gate electrode layer 152, the dielectric layer 154, and the conductive structure 156 may be the same as, or similar to, those used to form the gate electrode layer 152, the dielectric layer 154, and the conductive structure 156 in the previous embodiments. For the purpose of brevity, the descriptions of these processes are not repeated herein.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The extending portion 152e may be formed in a trench 158 between the first region 102a and the second region 102b. The bottom portion of the fin isolation structure 116 between the first region 102a and the second region 102b may remain, and it is in contact with the gate electrode layer 152.

Figure 8A:
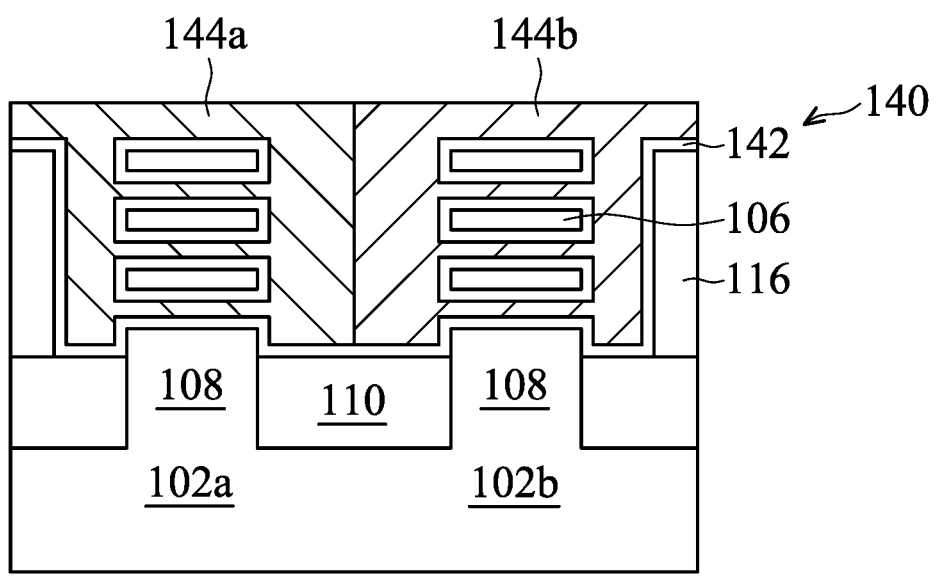
FIGS. 8A-8C are cross-sectional representations of various stages of forming a semiconductor device structure, in accordance with some embodiments of the disclosure.
Figure 8B:
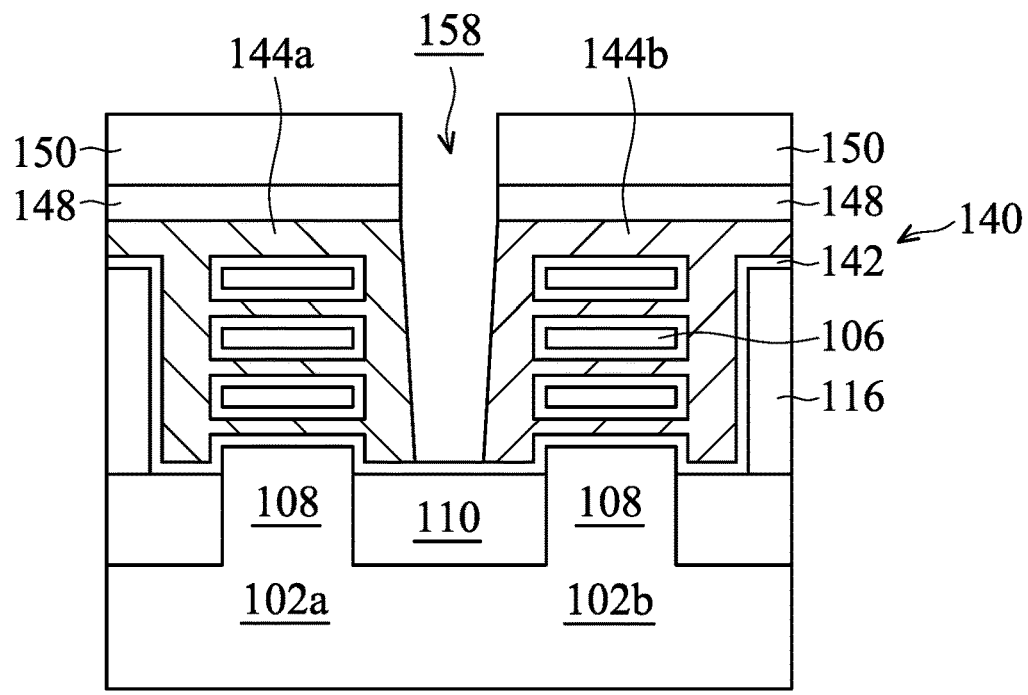
Figure 8C:
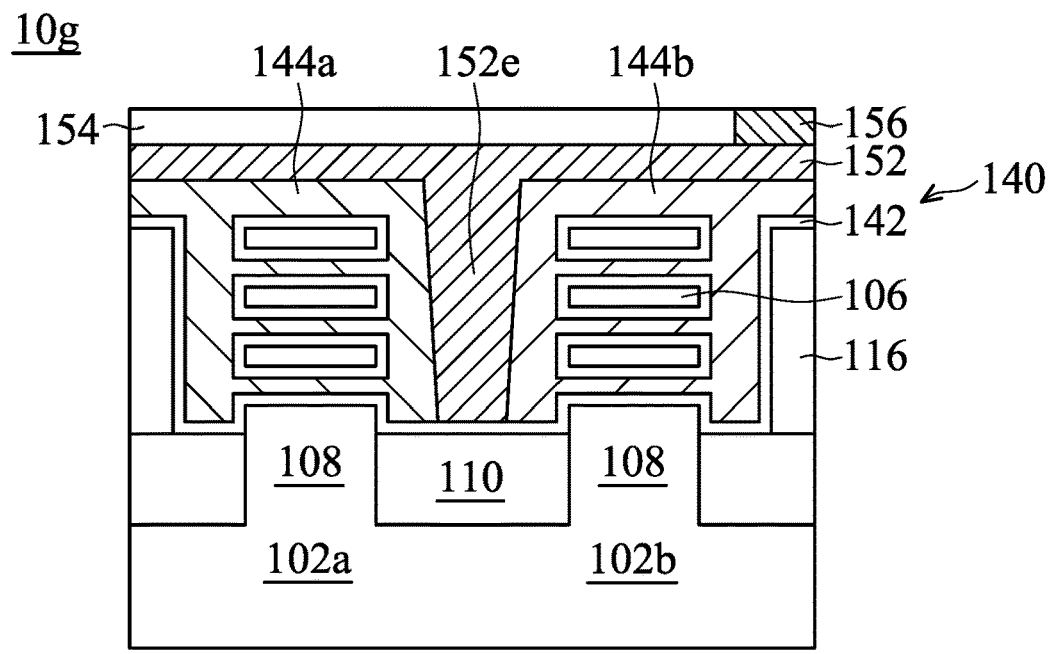

Many variations and/or modifications may be made to the embodiments of the disclosure. FIGS. 8A-8C are cross-sectional representations of various stages of forming a semiconductor device structure 10g in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 8A, the fin isolation structure 116 is not formed between the region 102a and the region 102b.

Next, a hard mask layer 148 and a photoresist layer 150 is formed over the first work function layer 144a and the second work function layer 144b, as shown in FIG. 8B in accordance with some embodiments. The hard mask layer 148 and a photoresist layer 150 is patterned so that the interface between of the first work function layer 144a and the second work function layer 144b may be exposed.

Later, the first work function layer 144a and the second work function layer 144b is etched by an etching process, and a trench 158 is formed between the first work function layer 144a and the second work function layer 144b, as shown in FIG. 8B in accordance with some embodiments. In some embodiments, the dielectric layer 142 is exposed in the trench 158. The etching process may be a dry etching process or a wet etching process. Since there is no fin isolation structure formed between the first work function layer 144a and the second work function layer 144b, the etching process may be easier.

Next, a gate electrode layer 152 is formed in the trench 158 and over the first work function layer 144a and the second work function layer 144b, as shown in FIG. 8C in accordance with some embodiments. The gate electrode layer 152 may have an extending portion 152e formed in the trench 158. In some embodiments, each of the extending portions 152e of the gate electrode layer 152 is in contact with the sidewalls of the first work function layer 144a and the second work function layer 144b. In some embodiments, the bottom surface of the extending portion 152e of the gate electrode layer 152 is substantially level with the bottom surfaces of the first work function layer 144a and the second work function layer 144b.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The extending portion 152e may be formed in a trench 158 between the first region 102a and the second region 102b. Without forming a fin isolation structure 116 between the first work function layer 144a and the second work function layer 144b, it may be easier to form the trench 158. Since the size of the extending portion 152e of the gate electrode layer 152 is greater than in previous embodiments, the gate resistance may be further reduced.

Figure 9A:
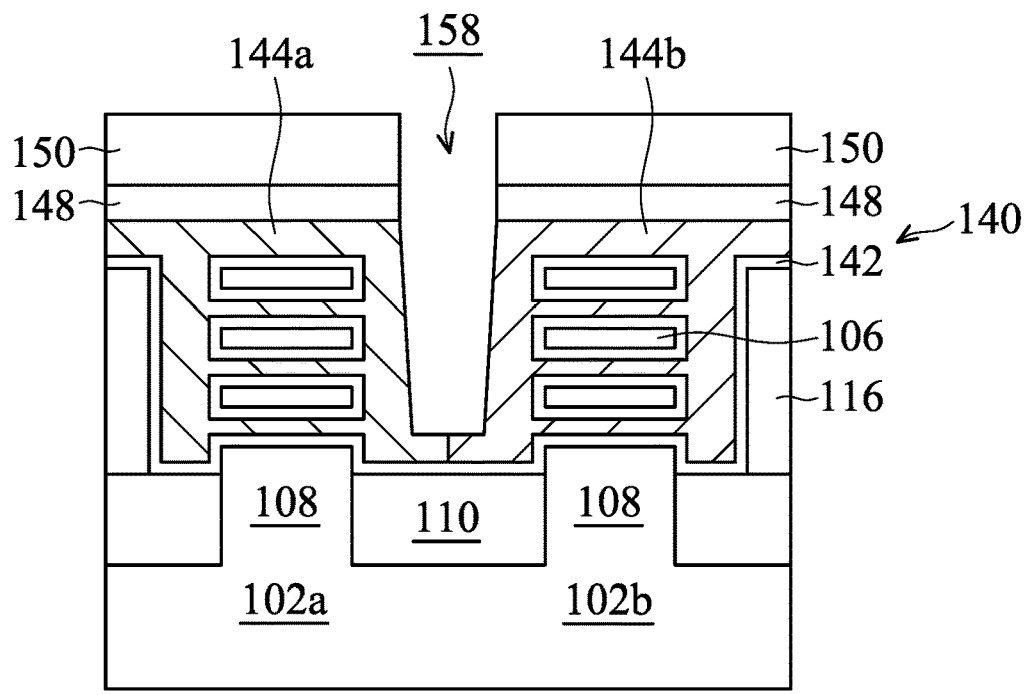
FIGS. 9A-9B are cross-sectional representations of various stages of forming a semiconductor device structure, in accordance with some embodiments of the disclosure.
Figure 9B:
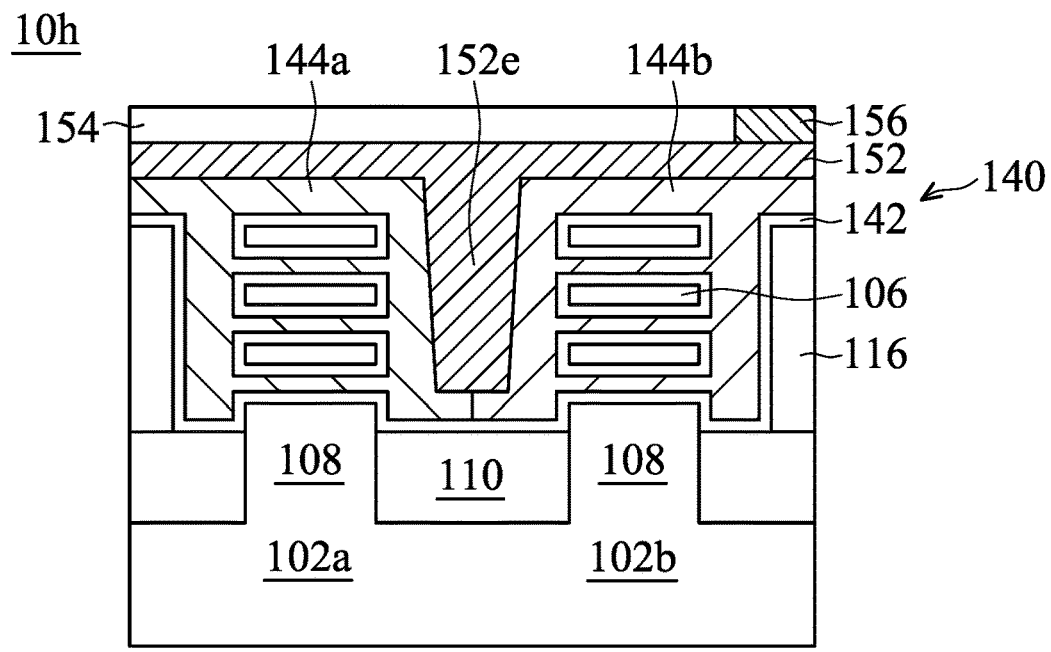

Many variations and/or modifications may be made to the embodiments of the disclosure. FIGS. 9A-9B are cross-sectional representations of various stages of forming a semiconductor device structure 10h, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 9A, the fin isolation structure 116 between the first region 102a and the second region 102b is only partially removed, and the interface between the first work function layer 144a and the second work function layer 144b is exposed.

In some embodiments as shown in FIG. 9A, since the fin isolation structure 116 is not formed between the region 102a and the region 102b, and the first work function layer 144a and the second work function layer 144b between the region 102a and the region 102b is only partially removed, the interface between the first work function layer 144a and the second work function layer 144b is exposed in the trench 158.

Later, a gate electrode layer 152 is formed in the trench 158 and over the first work function layer 144a and the second work function layer 144b, as shown in FIG. 9B in accordance with some embodiments. The gate electrode layer 152 may have an extending portion 152e formed in the trench 158. In some embodiments, each of the extending portions 152e of the gate electrode layer 152 is in contact with the sidewalls of the first work function layer 144a and the second work function layer 144b. In some embodiments, the bottom surface of the extending portion 152e of the gate electrode layer 152 is in contact with the interface between the first work function layer 144a and the second work function layer 144b. In some embodiments, the extending portion 152e of the gate electrode layer 152 is disposed directly over the interface between the first work function layer 144a and the second work function layer 144b.

With the cladding gate electrode layer 152 extends in the first work function layer 144a and the second work function layer 144b, the gate resistance may be reduced and the ring oscillator speed may be improved. The extending portion 152e of the gate electrode layer 152 may also help to provide channel strain for mobility improvement. The first work function layer 144a and the second work function layer 144b may be in contact with each other under the gate electrode layer 152.

As described previously, the cladding gate electrode 152 has an extending portion 152e protruding in the first work function layer 144a and the second work function layer 144b. The gate resistance may be reduced, and the device speed and the mobility may be improved. In some embodiments as shown in FIG. 3, the extending portion 152e has tapered sidewalls. In some embodiments as shown in FIG. 4, the extending portion 152e is conformally formed over sidewalls of the first work function layer 144a and the second work function layer 144b. In some embodiments as shown in FIG. 5C, the extending portion 152e is only formed in the second work function layer 144b and the production cost is reduced. In some embodiments as shown in FIG. 6G, the extending portion 152e is formed in a trench 158 between the first region 102a and the second region 102b, and the gate resistance is further reduced with larger extending portion 152e In some embodiments as shown in FIG. 7B, the extending portion 152e is formed in a trench 158 above the fin isolation structure 116 between the first region 102a and the second region 102b. In some embodiments as shown in FIG. 8A, the fin isolation structure 116 between the first region 102a and the second region 102b is not formed, and only portions of the first work function layer 144a and the second work function layer 144b are removed to form the trench 158 for the extending portion 152e to be formed in. In some embodiments as shown in FIG. 9B, the extending portion 152e is formed over an interface between the first work function layer 144a and the second work function layer 144b.

Embodiments of a semiconductor device structure and a method for forming the same are provided. The method for forming the semiconductor device structure may include forming a cladding gate electrode layer with an extending portion protruding beside the nanostructures. Therefore, the gate resistance may be reduced, and the mobility and the device speed may be enhanced.

In some embodiments, a semiconductor device structure is provided. The semiconductor device structure includes nanostructures formed over a substrate. The semiconductor device structure further includes a fin isolation structure formed beside the nanostructures. The semiconductor device structure further includes a work function layer surrounding the nanostructures and covering a sidewall of the fin isolation structure. The semiconductor device structure further includes a gate electrode layer covering the work function layer. The gate electrode layer has an extending portion surrounded by the work function layer.

In some embodiments, a semiconductor device structure is provided. The semiconductor device structure includes first nanostructures and second nanostructures formed over a substrate. The semiconductor device structure further includes a first work function layer surrounding the first nanostructures. The semiconductor device structure further includes a second work function layer surrounding the second nanostructures. The semiconductor device structure further includes a gate electrode layer covering the first work function layer and the second work function layer. The gate electrode layer has an extending portion protruding in the first work function layer.

In some embodiments, a method for forming a semiconductor device structure is provided. The method for forming a semiconductor device structure includes forming a fin structure with alternating stacked first semiconductor layers and second semiconductor layers over a substrate. The method for forming a semiconductor device structure also includes forming a fin isolation structure beside the fin structure. The method for forming a semiconductor device structure also includes forming a dummy gate structure across the fin structure. The method for forming a semiconductor device structure also includes forming a source/drain opening in the fin structure beside the dummy gate structure. The method for forming a semiconductor device structure also includes forming epitaxial structures in the source/drain opening. The method for forming a semiconductor device structure also includes removing the dummy gate structure and the first semiconductor layers to form a gate opening between the second semiconductor layers and between the second semiconductor layers and the fin isolation structure. The method for forming a semiconductor device structure also includes forming a dielectric layer in the gate opening surrounding the second semiconductor layers and over the sidewalls of the fin isolation structure. The method for forming a semiconductor device structure also includes forming a first work function layer in the gate opening surrounding the dielectric layer and over the sidewalls of the fin isolation structure. The method for forming a semiconductor device structure also includes forming a gate electrode layer in the gate opening between the second semiconductor layers and the fin isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a fin structure with alternating stacked first semiconductor layers and second semiconductor layers over a substrate;
   forming a fin isolation structure beside the fin structure;
   forming a dummy gate structure across the fin structure;
   forming a source/drain opening in the fin structure beside the dummy gate structure;
   forming epitaxial structures in the source/drain opening;
   removing the dummy gate structure and the first semiconductor layers to form a gate opening between the second semiconductor layers and between the second semiconductor layers and the fin isolation structure;
   forming a dielectric layer in the gate opening surrounding the second semiconductor layers and over the sidewalls of the fin isolation structure;
   forming a first work function layer in the gate opening surrounding the dielectric layer and over the sidewalls of the fin isolation structure; and
   forming a gate electrode layer in the gate opening between the second semiconductor layers and the fin isolation structure.

2. The method for forming the semiconductor device structure as claimed in claim 1, wherein the first work function layer is conformally formed over the second semiconductor layers, and the gate electrode layer is conformally formed over the first work function layer.

3. The method for forming the semiconductor device structure as claimed in claim 1, further comprising:
   forming a second work function layer in the gate opening surrounding the second semiconductor layers and over the sidewalls of the fin isolation structure.

4. The method for forming the semiconductor device structure as claimed in claim 3, wherein the second work function layer is formed over the first work function layer, and the second work function layer is in contact with the first work function layer.

5. The method for forming the semiconductor device structure as claimed in claim 3, further comprising:
   removing the fin isolation structure between the first work function layer and the second work function layer to form a trench; and
   forming the gate electrode layer in the trench.

6. The method for forming the semiconductor device structure as claimed in claim 5, wherein the dielectric layer is exposed in the trench.

7. The method for forming the semiconductor device structure as claimed in claim 3, further comprising:
   forming a trench between the first work function layer and the second work function layer; and
   forming the gate electrode layer in the trench.

8. A method for forming a semiconductor device structure, comprising:
   forming a stack comprising first semiconductor layers and second semiconductor layers over a substrate;
   forming a fin isolation structure adjacent to the stack;

removing the first semiconductor layers to form a gate opening between the second semiconductor layers and between the second semiconductor layers and the fin isolation structure;

forming a first work function layer in the gate opening and leaving first gaps on opposite sides of the second semiconductor layers; and forming a gate electrode layer covering the first work function layer and in the first gaps.

9. The method for forming the semiconductor device structure as claimed in claim 8, wherein the first gaps expose a bottom portion of the first work function layer.

10. The method for forming the semiconductor device structure as claimed in claim 8, wherein the first gaps extend between the fin isolation structure and the second semiconductor layers.

11. The method for forming the semiconductor device structure as claimed in claim 8, further comprising:

before forming a gate electrode layer, forming a second work function layer in the gate opening and leaving second gaps;

forming a hard mask layer covering the second work function layer and in the second gaps; and removing the hard mask layer, wherein the gate electrode layer is further formed over the second work function layer and in the second gaps.

12. The method for forming the semiconductor device structure as claimed in claim 8, wherein the first gaps have a downward trapezoid shape.

13. The method for forming the semiconductor device structure as claimed in claim 8, wherein the first gaps have a curved sidewall.

14. A method for forming a semiconductor device structure, comprising:

forming first nanostructures and second nanostructures over a substrate;

forming a first work function layer surrounding the first nanostructures;

forming a second work function layer surrounding the second nanostructures;

partially removing the first work function layer and the second work function layer to form a trench; and forming a gate electrode layer covering the first work function layer and the second work function layer and in the trench.

15. The method for forming the semiconductor device structure as claimed in claim 14, further comprising:

forming a dielectric layer before forming the first work function layer and the second work function layer, wherein the trench exposes the dielectric layer.

16. The method for forming the semiconductor device structure as claimed in claim 14, further comprising forming an isolation structure adjacent to the stack, wherein the trench exposes a top surface of the isolation structure.

17. The method for forming the semiconductor device structure as claimed in claim 16, wherein the fin isolation structure is formed over the isolation structure before forming the trench.

18. The method for forming the semiconductor device structure as claimed in claim 14, wherein forming the trench partially removes the fin isolation structure.

19. The method for forming the semiconductor device structure as claimed in claim 14, wherein the trench exposes a sidewall of the first work function layer and a sidewall of the second work function layer.

20. The method for forming the semiconductor device structure as claimed in claim 19, wherein the trench exposes an interface between the first work function layer and the second work function layer.

* * * * *